United States Patent
Kim et al.

(10) Patent No.: US 9,520,409 B2
(45) Date of Patent: Dec. 13, 2016

(54) THREE-DIMENSIONAL NONVOLATILE MEMORY DEVICE, SEMICONDUCTOR SYSTEM INCLUDING THE SAME, AND METHOD OF MANUFACTURING THE SAME

(71) Applicant: SK hynix Inc., Icheon-si Gyeonggi-do (KR)

(72) Inventors: Tae Kyung Kim, Cheongju-si (KR); Dae Sung Eom, Cheongju-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 15/016,425

(22) Filed: Feb. 5, 2016

(65) Prior Publication Data
US 2016/0163734 A1 Jun. 9, 2016

Related U.S. Application Data

(62) Division of application No. 14/502,776, filed on Sep. 30, 2014, now Pat. No. 9,287,286.

(30) Foreign Application Priority Data

May 23, 2014 (KR) ........................ 10-2014-0062422

(51) Int. Cl.
*H01L 21/76* (2006.01)
*H01L 27/115* (2006.01)
*G11C 16/06* (2006.01)
*H01L 21/768* (2006.01)

(52) U.S. Cl.
CPC ........ *H01L 27/11582* (2013.01); *G11C 16/06* (2013.01); *H01L 21/76897* (2013.01); *H01L 27/1157* (2013.01); *H01L 27/11578* (2013.01)

(58) Field of Classification Search
CPC ....... H01L 27/222; H01L 29/792; H01L 45/04
USPC ............................... 438/444, 734, FOR. 212
See application file for complete search history.

(56) References Cited

U.S. PATENT DOCUMENTS

| | | | | |
|---|---|---|---|---|
| 2010/0213538 A1* | 8/2010 | Fukuzumi | ............... | G11O 5/02 257/326 |
| 2012/0241843 A1* | 9/2012 | Iino | ................... | H01L 21/76801 257/324 |
| 2013/0107602 A1* | 5/2013 | Oh | .................... | H01L 27/11556 365/51 |

* cited by examiner

*Primary Examiner* — Tan N Tran
(74) *Attorney, Agent, or Firm* — William Park & Associates Ltd.

(57) ABSTRACT

A three-dimensional nonvolatile memory device includes a first vertical channel layer and a second vertical channel layer extending from a substrate, a plurality of memory cells, first selection transistors and second selection transistors spaced apart from each other along the first vertical channel layer and the second vertical channel layer, a pad, a contact plug and a bit line in a stacked configuration over the first vertical channel layer, and a common source line formed over the second vertical channel layer.

8 Claims, 25 Drawing Sheets ically include memory cells arranged in a three dimensional configuration. Since memory devices having a three dimensional structure often utilize the area of a substrate relatively more efficiently than a memory device having a two-dimensional structure, memory devices having a three-dimensional structured memory devices may permit a relatively greater degree of integration. Examples of such memory devices include nonvolatile memory devices. An example of a nonvolatile memory device is a NAND flash memory.

THREE-DIMENSIONAL NONVOLATILE MEMORY DEVICE, SEMICONDUCTOR SYSTEM INCLUDING THE SAME, AND METHOD OF MANUFACTURING THE SAME

CROSS-REFERENCE TO RELATED APPLICATION

The present application is a Division of U.S. application Ser. No. 14/502,776, filed on Sep. 30, 2014, and the present application claims priority to Korean patent application number 10-2014-0062422, filed on May 23, 2014, the entire disclosure of which is incorporated herein in its entirety by reference.

BACKGROUND

Field of Invention

Various embodiments relate generally to a nonvolatile memory device, and more particularly, to a three-dimensional nonvolatile memory device, a semiconductor system including the same, and a method of manufacturing the same.

Description of Related Art

Memory devices having a three-dimensional structure typically include memory cells arranged in a three dimensional configuration. Since memory devices having a three dimensional structure often utilize the area of a substrate relatively more efficiently than a memory device having a two-dimensional structure, memory devices having a three-dimensional structured memory devices may permit a relatively greater degree of integration. Examples of such memory devices include nonvolatile memory devices. An example of a nonvolatile memory device is a NAND flash memory.

Three-dimensional nonvolatile memory device may include a plurality of strings. Each string includes memory cells stacked in a plurality of layers over a substrate and a selection transistor. Each string may have an 'I' shape or a 'U' shape. A three-dimensional nonvolatile memory device having I-shaped strings may be referred to as a Terabit Cell Array Transistor (TCAT) or Bit-Cost Scalable (BICS). A three-dimensional nonvolatile memory device having a U-shaped string may be referred to as Pipe-shaped Bit-Cost Scalable (P-BICS).

In the implementation of P-BICS technology, a string typically includes two vertical channel layers. For example, a first vertical channel layer and a second vertical channel layer may be electrically coupled via a pipe transistor, a bit line may be electrically coupled to an upper portion of the first vertical channel layer, and a source line may be electrically coupled to an upper portion of the second vertical channel layer.

A contact plug may be formed between the first vertical channel layer and the bit line and may electrically couple the first vertical channel layer and the bit line. A contact plug may be formed between the second vertical channel line and the source line and may electrically couple the second channel layer and the source line.

SUMMARY

An embodiment of a three-dimensional nonvolatile memory device may include a first vertical channel layer and a second vertical channel layer extending from a substrate, a plurality of memory cells, first selection transistors and second selection transistors spaced apart from each other along the first vertical channel layer and the second vertical channel layer, a pad, a contact plug and a bit line in a stacked configuration over the first vertical channel layer, and a common source line formed over the second vertical channel layer.

An embodiment of a semiconductor system may include a three-dimensional nonvolatile memory device including a first vertical channel layer and a second vertical channel layer extending from a substrate, a plurality of memory cells, first selection transistors and second selection transistors spaced apart from each other along the first vertical channel layer and the second vertical channel layer, a pad, a contact plug and a bit line in a stacked configuration over the first vertical channel layer, and a common source line formed over the second vertical channel layer and a memory controller configured to control at least one operation of the three-dimensional nonvolatile memory device.

An embodiment of a method of manufacturing a three-dimensional nonvolatile memory device may include depositing a plurality of interlayer insulating layers and a plurality of sacrificial layers in a stacked configuration along first vertical channel layers and second vertical channel layers, wherein the first and second vertical channel layers extend from a substrate, etching portions of the plurality of the interlayer insulating layers and the plurality of sacrificial layers to form a slit, wherein portions of the sacrificial layers are exposed through a sidewall of the slit, removing the portions of the sacrificial layers exposed through the slit to form recesses between the interlayer insulating layers, filling the recesses with conductive layers to form a plurality of word lines, forming pads having a generally island shape over the first vertical channel layers, forming a common source line having a generally rectangular shape over the second vertical channel layers, forming contact plugs over the pads, and forming a bit line over the contact plugs.

DETAILED DESCRIPTION

Figure 1:
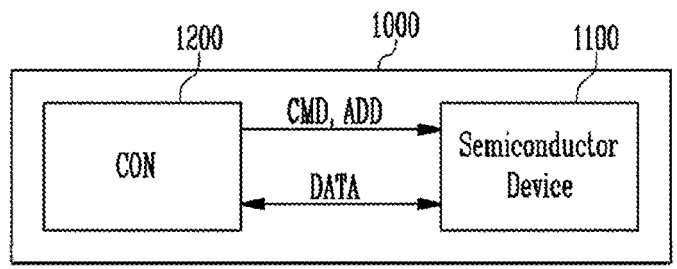
FIG. 1 is a block diagram representation of an embodiment of a semiconductor system.

Various embodiments will be described with reference to the accompanying drawings. Throughout the disclosure, like reference numerals correspond directly to the like numbered parts in the figures and embodiments.

FIG. 1 is a block diagram representation of an embodiment of a semiconductor system 1000.

The semiconductor system 1000 may include a semiconductor device 1100 and a controller (CON) 1200. The controller 1200 may be configured to control the operation of the semiconductor device 1100. For example, the controller 1200 may transmit a command CMD and an address ADD to the semiconductor device 1100 in response to a command received from another device. The semiconductor device 1100 may perform one or more of a program operation, a read operation and an erase operation in response to the command CMD and the address ADD. The semiconductor device 1100 and the controller 1200 may be configured to exchange data DATA.

Figure 2:
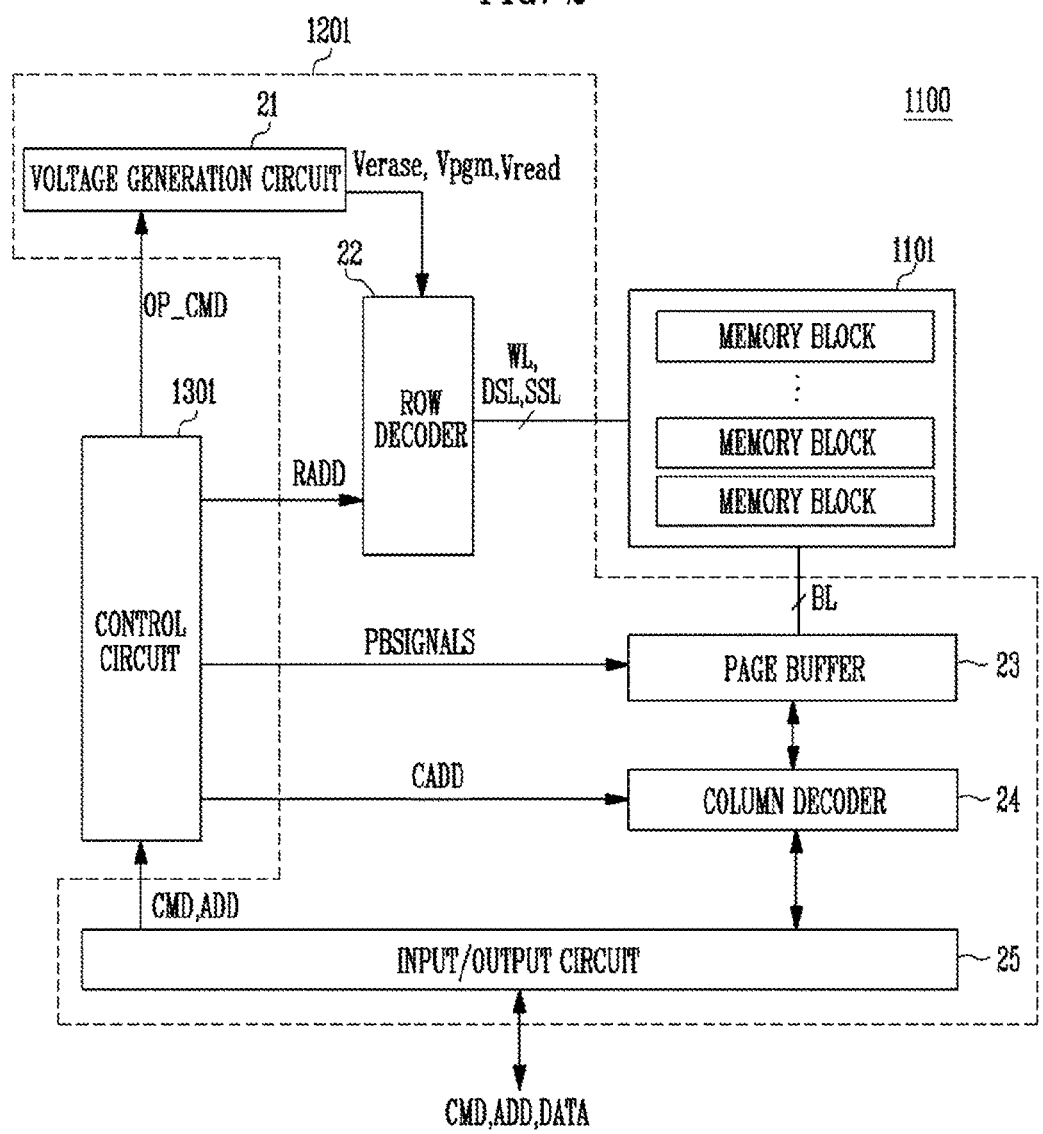
FIG. 2 is a block diagram representation of an embodiment of a semiconductor device in the semiconductor system shown in FIG. 1.

FIG. 2 is a block diagram representation of an embodiment of a semiconductor device 1100 in a semiconductor system.

The semiconductor device 1100 may include a memory cell array 1101, a circuit group 1201, and a control circuit 1301. The memory cell array 1101 may be configured to store data. The circuit group 1201 may be configured to perform one or more of a program operation, a read operation and an erase operation on the memory cell array 1101. The control circuit 1301 may be configured to control the operation of the circuit group 1201.

The memory cell array 1101 may include a plurality of memory blocks. Each of the plurality of memory blocks may include a plurality of memory cells. The memory blocks may have substantially the same configuration. In an embodiment, the memory blocks may have a three-dimensional structure where the memory cells are arranged in three-dimensional configuration. A memory block having a three-dimensional structure will be described below with reference to FIG. 3.

The circuit group 1201 may include a voltage generation circuit 21, a row decoder 22, a page buffer 23, a column decoder 24 and an input/output circuit 25.

The voltage generation circuit 21 may be configured to generate operating voltages having voltage levels in response to an operating commands OP_CMD. The different types of operating commands OP_CMD may include a program command, a read command and an erase command. For example, when the program command is received at the voltage generation circuit 21, the voltage generation circuit 21 may be configured to generate operating voltages having voltage levels associated with the program operation. An example of such an operating voltage is a program voltage Vpgm. When a read command is received at the voltage generation circuit 21, the voltage generation circuit 21 may be configured to generate operating voltages having voltage levels associated with the read operation. An example of an operating voltage associated with a read operation is a read voltage Vread. When the erase command is received at the voltage generation circuit 21, the voltage generation circuit 21 may be configured to generate operating having voltage levels associated with an erase operation. An example of an operating voltage associated with an erase operation is an erase voltage Verase.

The row decoder 22 may be configured to select one of the plurality of memory blocks in the memory cell array 110 in response to a row address RADD. Transfer operating voltages generated by the voltage generation circuit 21 may be transmitted to lines that are electrically coupled to the selected memory block. Examples of such lines include word lines WL, drain selection lines DSL and source selection lines SSL.

The page buffer 23 may be electrically coupled to the memory blocks through the bit lines BL and may be configured to exchange data with the selected memory block during the program, read or erase operation in response to page buffer control signals PBSIGNALS. The page buffer 23 is configured to temporarily store the data that is being transmitted to or received from the selected memory block.

The column decoder 24 may be configured to exchange data with the page buffer 23 in response to a received column address CADD.

The input/output circuit 25 may be configured to transfer a command CMD and an address ADD received from an external device to the control circuit 130, to transfer data DATA received from an external device to the column decoder 24, and to transfer data DATA received from the column decoder 24 to an external device.

The control circuit 1301 may be configured to transmit the operating command OP_CMD, the row address RADD, the page buffer control signals PBSIGNALS and the column address CADD to control the circuit group 1201 in response to the received command CMD and address ADD.

Figure 3:
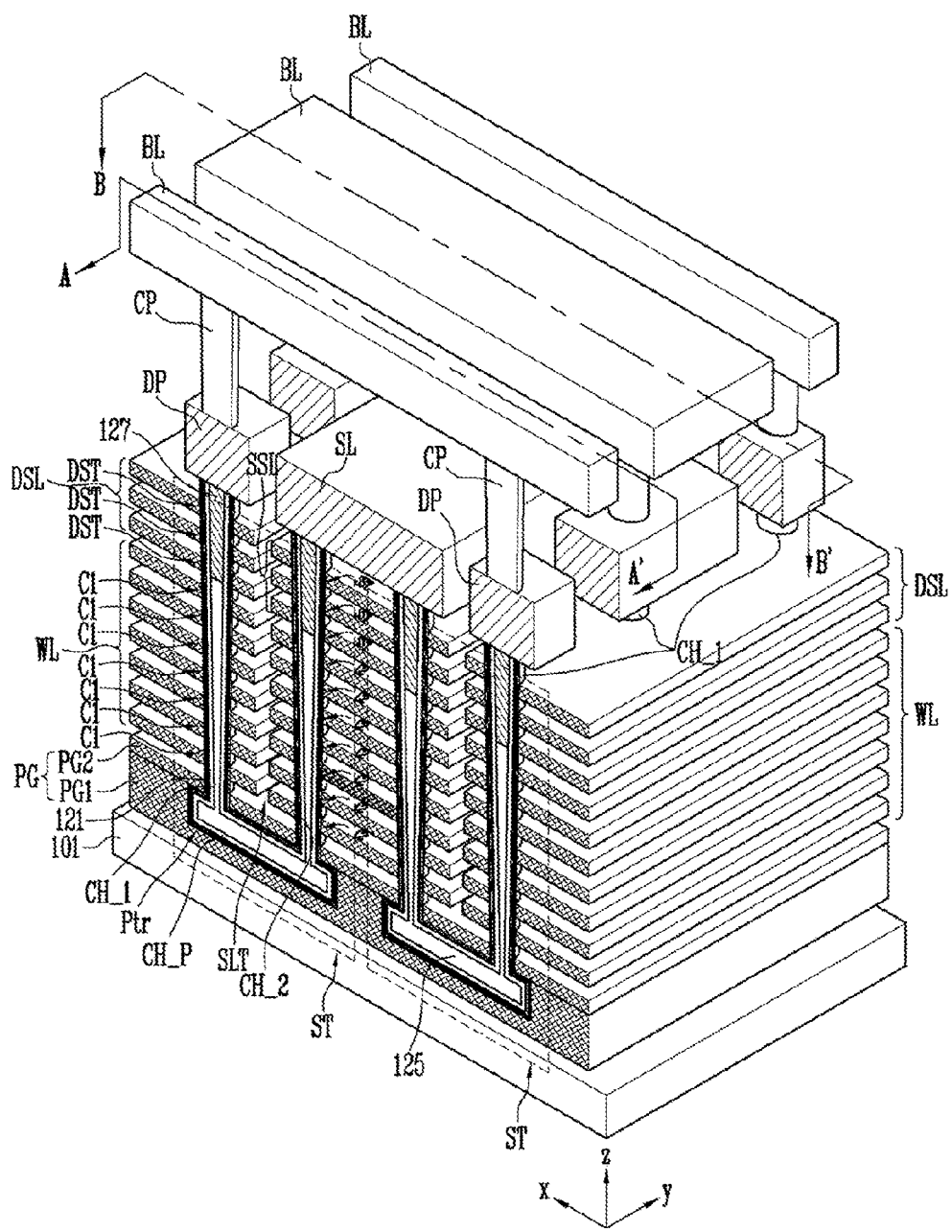
FIG. 3 is a perspective view of an embodiment of a three-dimensional nonvolatile memory device.

FIG. 3 is a perspective view of an embodiment of a three-dimensional nonvolatile memory device.

The memory block of the three-dimensional nonvolatile memory device may include a plurality of U-shaped strings ST. Each of the strings ST may include a first vertical channel layer CH_1 and a second vertical channel layer CH_2. The first vertical channel layer CH_1 and the second vertical channel layer CH_2 may be electrically coupled through a pipe channel layer CH_P formed at a lower portion of the U-shaped string. A drain contact pad DP may be formed on an upper portion of each of the first vertical channel layers CH_1. A contact plug CP may be formed on an upper portion of the drain contact pad DP. The drain contact pad DP may have a relatively greater width than an upper surface of the first vertical channel layer CH_1 and an upper surface of the contact plug CP. A bit line BL may extend across the upper surfaces of the contact plugs CP. A common source line SL may be extend across the upper portions of the second vertical channel layers CH_2. In an embodiment, the common source line SL may be directly electrically coupled to the second vertical channel layers CH_2 without any intervening contact plugs. The three-dimensionally structured memory block will be described in further detail below.

The bit lines BL may be configured as conductive patterns spaced apart and disposed over the substrate 101. The bit lines BL may be spaced apart and arranged in a generally parallel configuration with respect to each other. For example, the lengths of the bit lines BL may extend in a generally x direction and the bit lines BL may be arranged next to each other in a generally y direction in an xyz coordinate system.

The common source line SL may be a conductive pattern spaced apart from and disposed between the bit lines BL and the substrate 101. The common source line SL may extend generally along across the widths of the bit lines BL. For example, the common source line SL may extend in a generally y direction and with the width of the common source line SL extending in a generally x direction.

The string ST may include a pipe transistor Ptr having a first end and a second end. The string ST may include a first and second group of memory cells C1, C2, where the first group of memory cells C1 is electrically coupled to the first end of the pipe transistor Ptr and the second group of memory cells C2 is electrically coupled to the second end of the pipe transistor Ptr. The drain selection transistors DST and source selection transistors SST are electrically coupled to the first and second groups of memory cells C1, C2, respectively.

The pipe transistor Ptr may be formed at a junction between the pipe gate PG and the pipe channel layer CH_P. The pipe gate PG may include a first pipe gate PG1 spaced apart from and formed over the substrate 101. A trench may be formed in the first pipe gate PG1. The pipe channel layer CH_P may be formed on an inner wall surface of the trench.

In an embodiment, the pipe gate PG may include a second pipe gate PG2 that is configured to be in contact with the first pipe gate PG1 and disposed over the first pipe gate PG1. A pipe channel layer CH_P may be formed on a lower surface of the second pipe gate PG2 that is formed over the trench and extend through the second pipe gate PG2 that is formed over both ends of the trench. The second pipe gate PG2 may operate to extend an electric field forming region of the pipe channel layer CH_P. This configuration may result in an improvement in the flow of a cell current in the memory string ST. An outer wall surface of the pipe channel layer CH_P may be surrounded by the pipe gate PG with a multilayer film 121 interposed therebetween. The multilayer film 121 may be composed of insulating layers and include a charge trap layer extending from the first and second groups of memory cells C1, C2.

The first and second groups of the memory cell C1, C2 may include the memory cells C1 and C2 stacked in a plurality of layers between the substrate 101 and the bit lines BL or between the substrate 101 and the common source line SL. The first and second groups of memory cells C1, C2 may be arranged in a plurality of layers and may include the word lines WL and the vertical channel layers CH_1, CH_2. The word lines WL may be arranged in a plurality of layers may be space apart from and stacked over the pipe gate PG. The vertical channel layers CH_1, CH_2 may extend from an upper portion of the substrate 101 and extend towards the bit lines BL. The first and second groups of memory cells C1, C2 may be stacked along the vertical channel layers CH_1, CH_2. The pair of the vertical channel layers CH_1, CH_2 may be electrically coupled to the pipe channel layer CH_P of the memory string ST.

For the sake of convenience, in the description of the following example, the one of the pair of the vertical channel layers CH_1, CH_2 that is electrically coupled to the pad DP, will be referred to as the first vertical channel layer CH_1, and the other vertical channel layer that is electrically coupled to the common source line SL will be referred to as the second vertical channel layer CH_2.

The word lines WL of the first group of memory cells C1 stacked along the first vertical channel layer CH_1 and the word lines WL of the second group of memory cells C2 stacked along the second vertical channel layer CH_2 may be separated by a slit SLT formed between the first and second vertical channel layers CH_1, CH_2. The word lines WL may extend generally in a direction that crosses the width of the bit line BL. For example, the word lines WL in a plurality of layers may extend generally in the y direction, and the slit SLT may extend in a direction generally parallel to the word lines WL. The word lines WL may surround the first or second vertical channel layer CH_1, CH_2 with the multilayer film 121 interposed therebetween. The number of word lines WL may vary depending on the number of memory cells that are stacked.

Each of the first and second vertical channel layers CH_1, CH_2 may be formed to have a generally hollow tubular shape. The first and second vertical channel layers CH_1, CH_2 having the generally tubular shape may be filled with gap-filling insulating layers 125. The upper portions of the generally tubular shape first and second vertical channel layers CH_1, CH_2 may be filled with doped polysilicon layers 127. This configuration may reduce channel resistance. The multilayer film 121 may be formed by stacking a charge blocking layer, a charge trap layer and a tunnel insulating layer.

The drain selection transistors DST may be electrically coupled to an upper portion of the first vertical channel layer CH_1 and the source selection transistors SST may be electrically coupled to an upper portion of the second vertical channel layer CH_2.

The drain selection transistors DST may include the first vertical channel layer CH_1 and the drain selection lines DSL. The drain selection lines DSL may extend generally in a direction along the width of the bit line BL, for example, in the y direction. The drain selection lines DSL may overlap with the first vertical channel layer CH_1 surrounding the doped polysilicon layer 127.

The source selection transistors SST may include the second vertical channel layer CH_2 and the source selection lines SSL. The source selection lines SSL may extend generally in a direction along the width of the bit lines BL, for example, in the y direction. The source selection lines SSL may overlap with the second vertical channel layer CH_2 surrounding the doped polysilicon layer 127.

The pad DP, the contact plug CP and the bit line BL may be stacked over the first vertical channel layer CH_1. The pad DP may be formed to reduce or prevent misalignment between the contact plug CP and the first vertical channel layer CH_1. The pad DP may have a relatively greater width than the first vertical channel layer CH_1 and the contact plug CP. Since each the first vertical channel layers CH_1 are electrically insulated from each other, the pad DP may be formed in an island shape over each of the first vertical channel layers CH_1.

The common source line SL may be formed over the second vertical channel layers CH_2. The common source line SL and the pads DP may be formed in substantially the same plane. Since a source voltage is commonly transferred to the second vertical channel layers CH_2, the common source line SL may have a length that generally extends in the y direction.

In the configuration where a pad DP having a relatively greater width is formed between the first vertical channel layer CH_1 and the contact plug CP, electrical losses when a misalignment occurs during the manufacturing process of the contact plug CP. In the configuration where the common source line SL and the second vertical channel layer CH_2 are in direct electrical contact each other without the use of a contact plug therebetween, a misalignment caused by the contact plug in the common source line SL region may be reduced or prevented.

In the configuration where a common source line SL is formed over the second vertical channel layers CH_2, a degree of integration of the memory device may be improved and electrical losses may be reduced.

A method of manufacturing an embodiment of a three-dimensional nonvolatile memory device will be described.

Figure 4A:
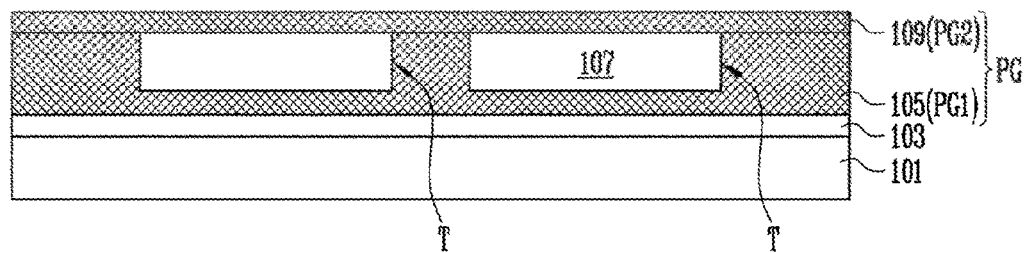
FIGS. 4A to 4Q are cross-sectional views taken along line A-A' of the perspective view of FIG. 3 for illustrating a method of manufacturing the three-dimensional nonvolatile memory device shown in FIG. 3.
Figure 4B:
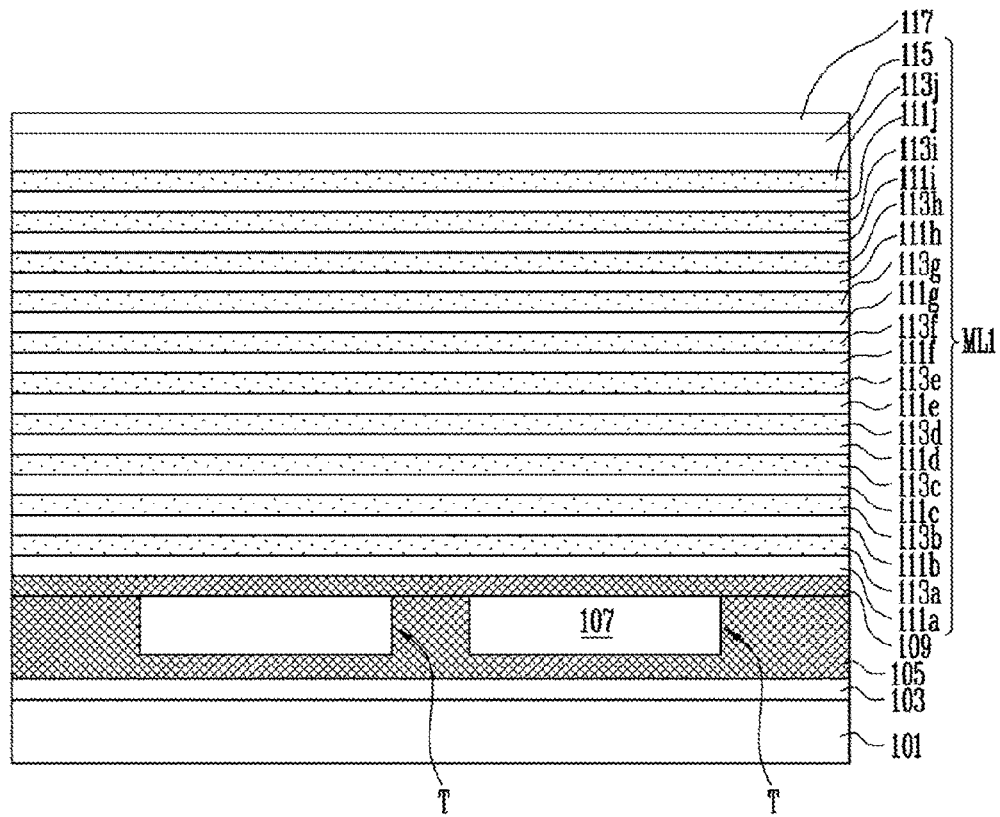
Figure 4C:
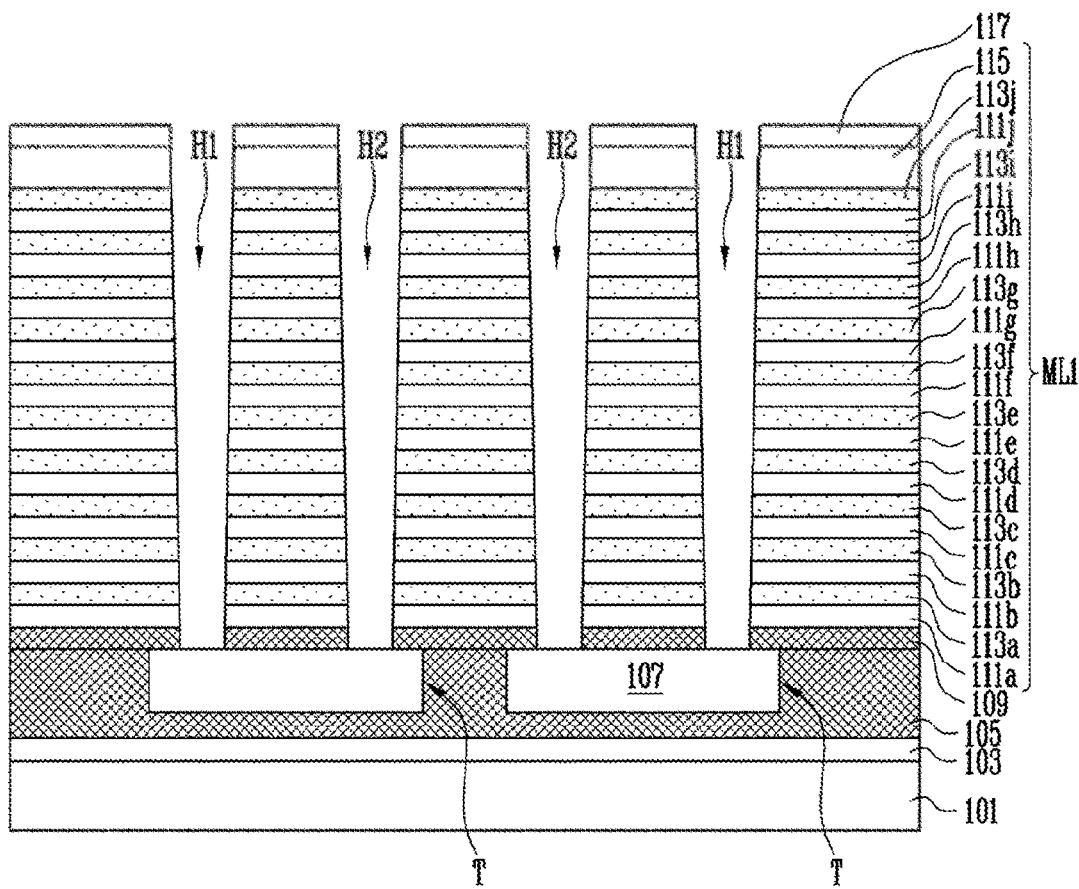
Figure 4D:
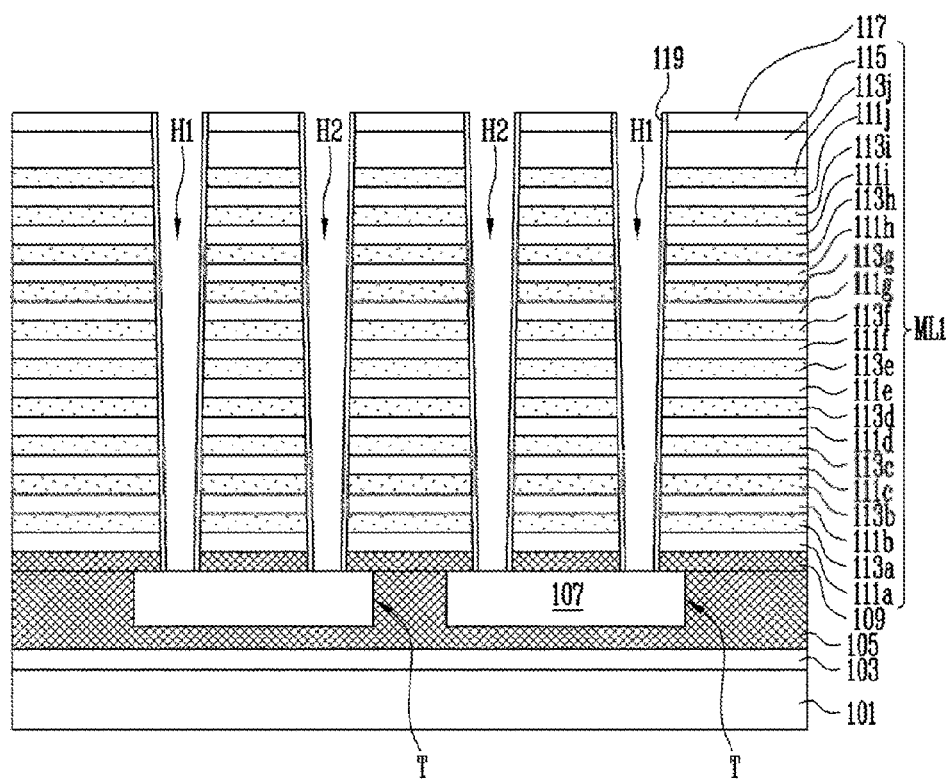
Figure 4E:
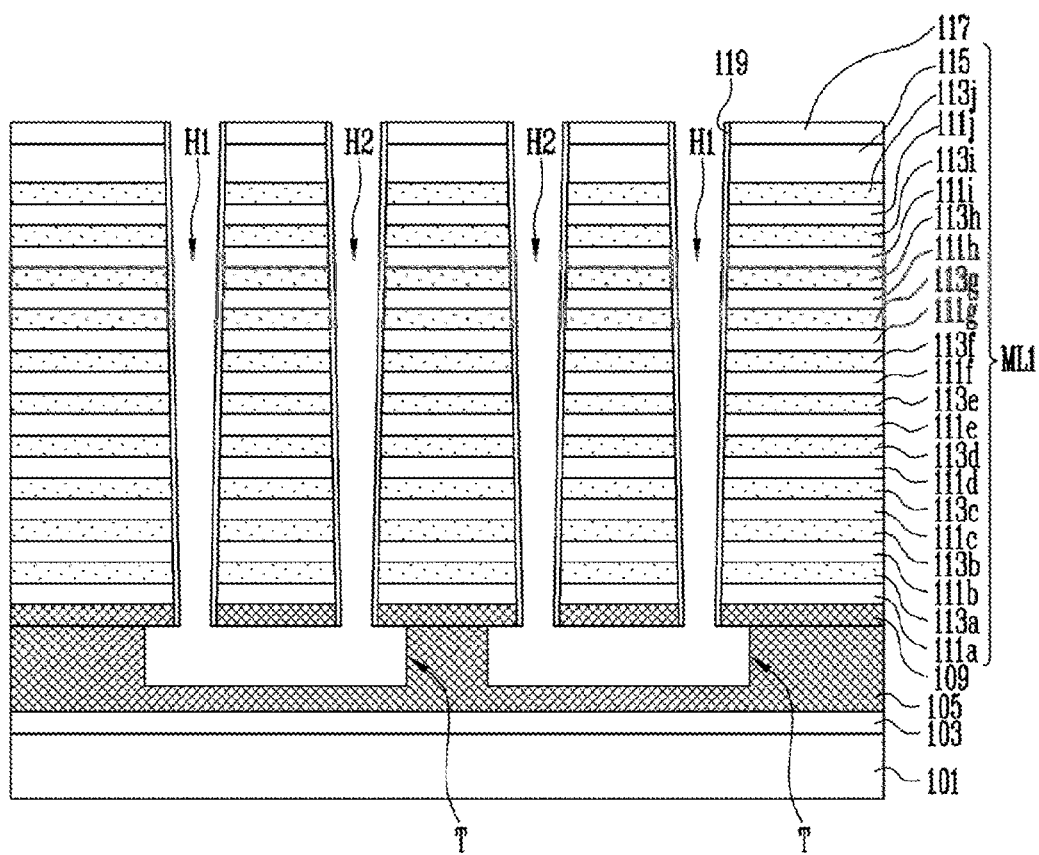
Figure 4F:
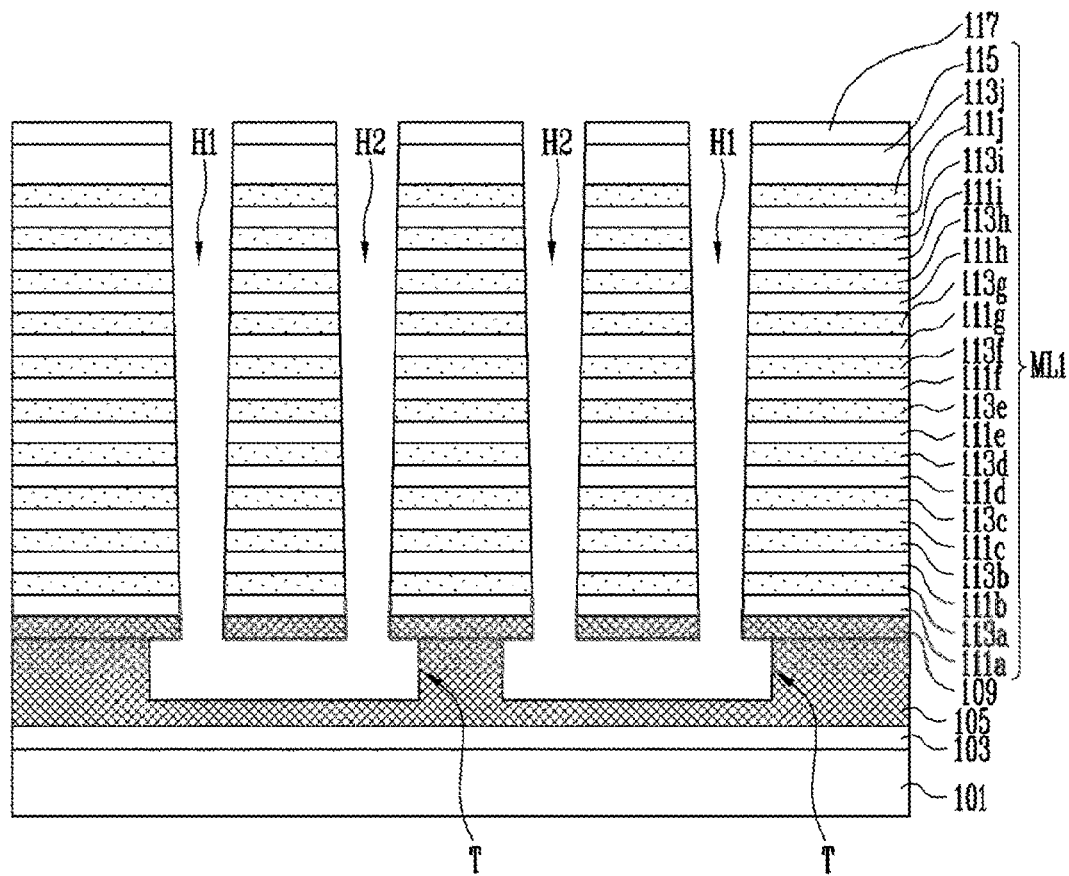
Figure 4G:
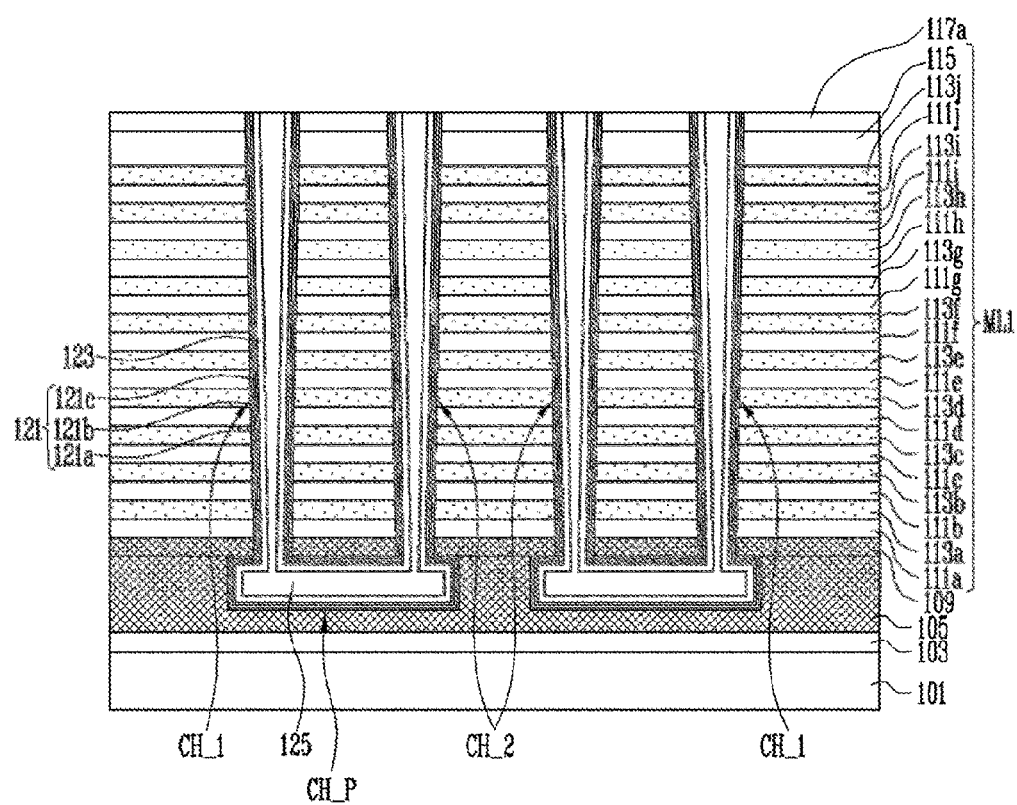
Figure 4H:
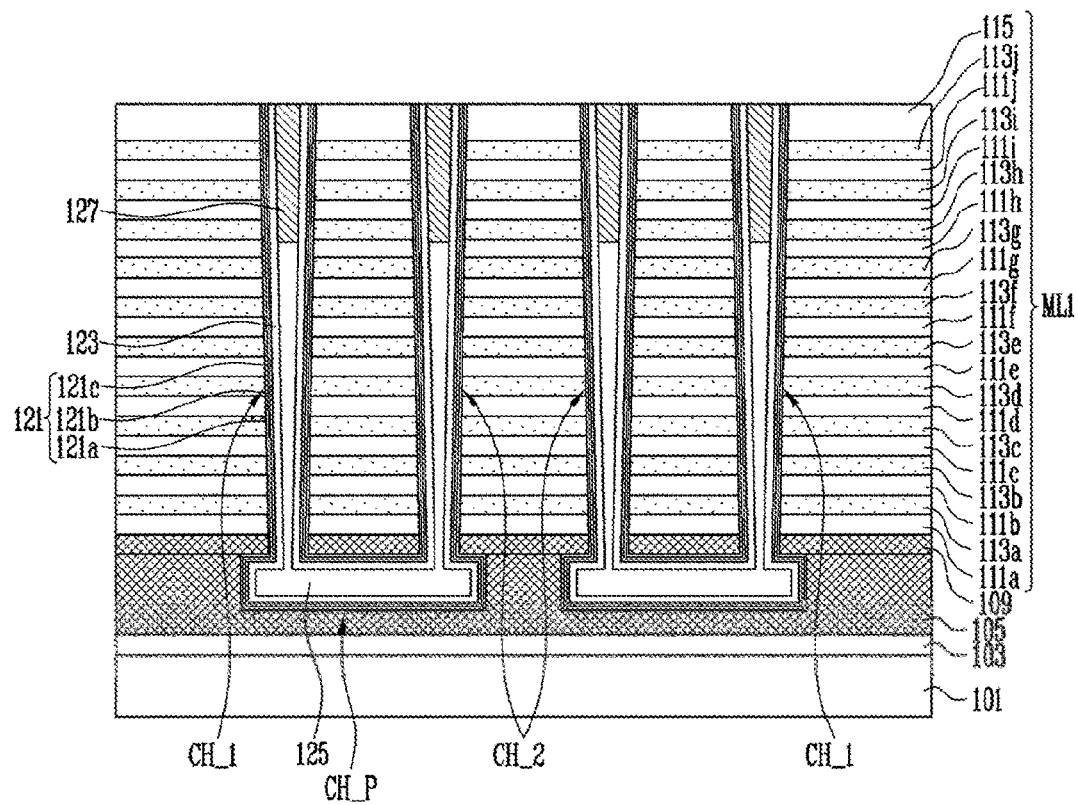
Figure 4I:
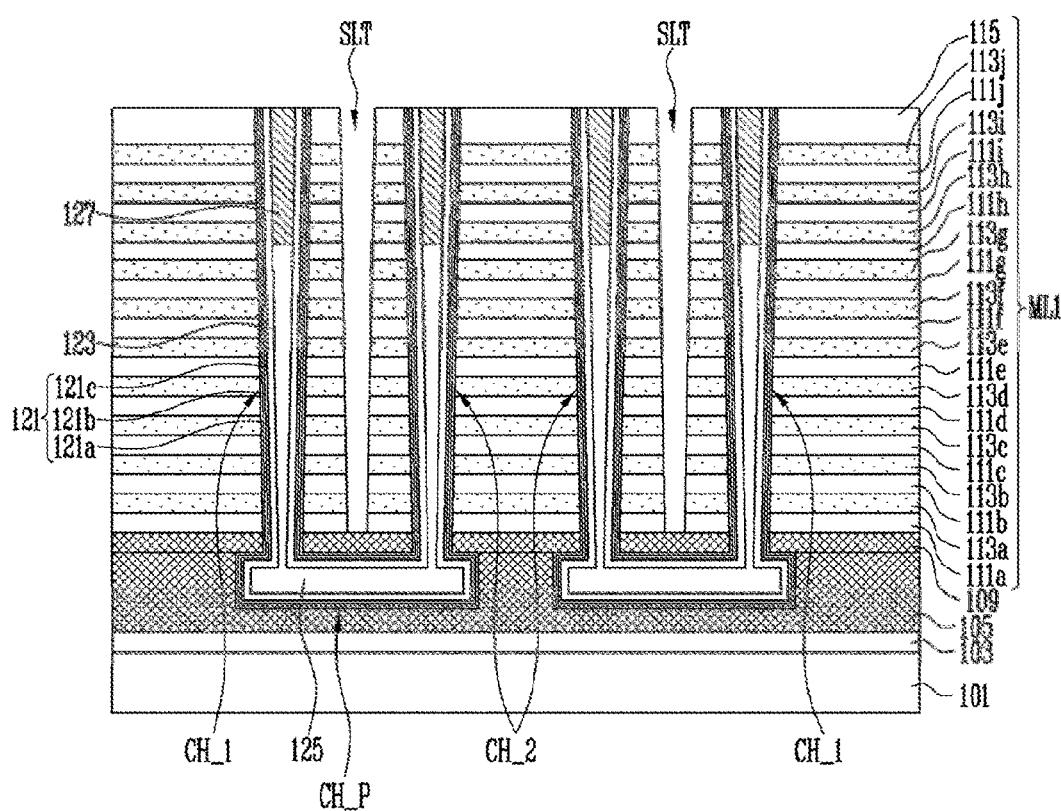
Figure 4J:
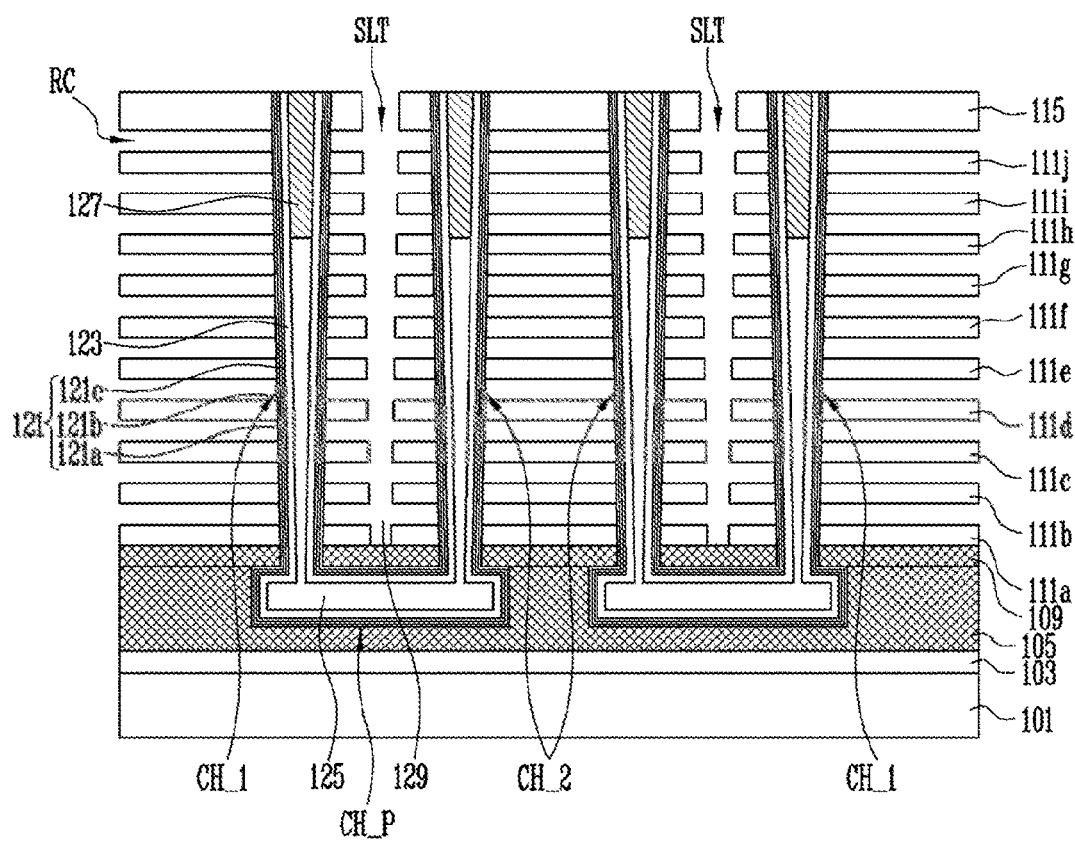
Figure 4K:
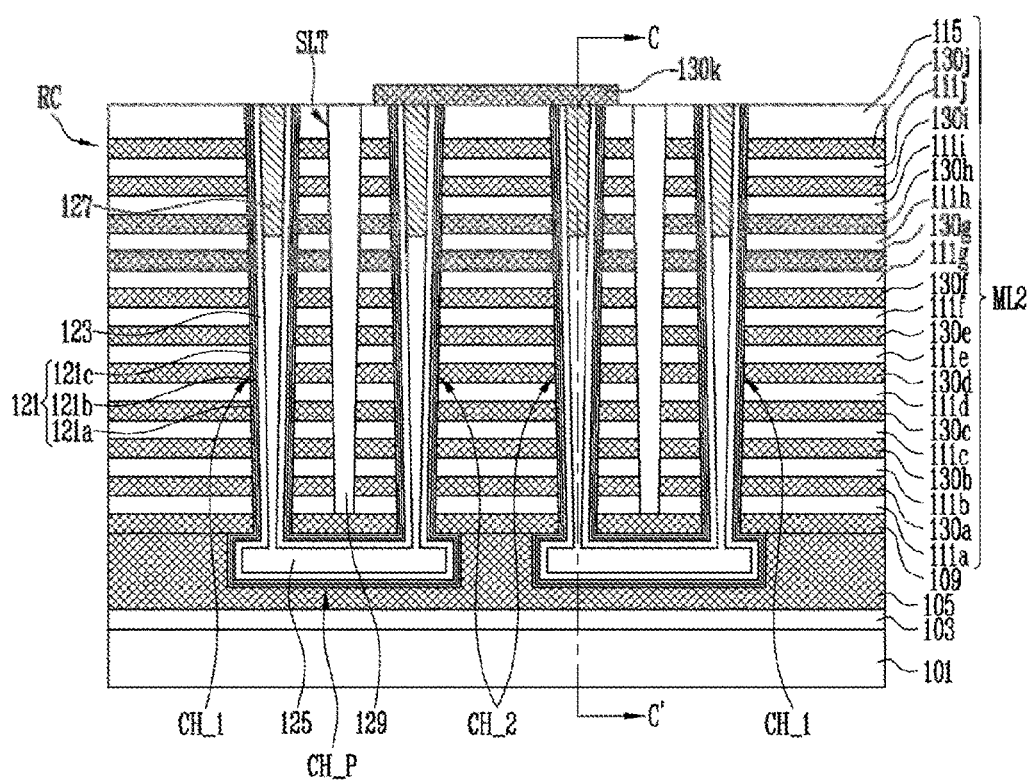
Figure 4L:
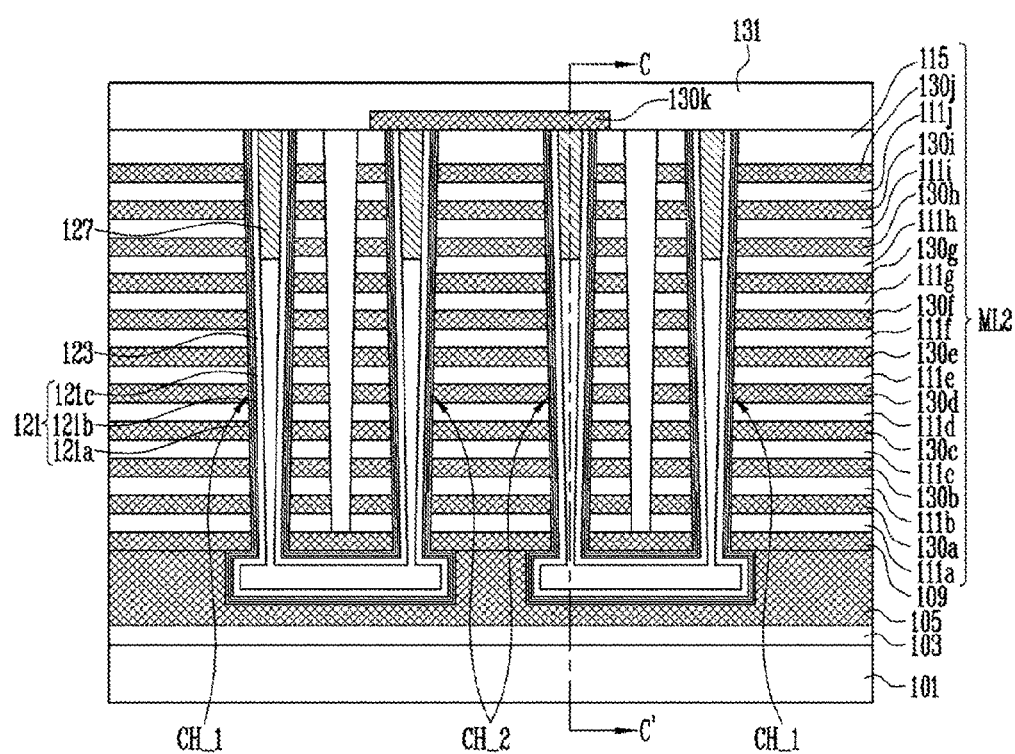
Figure 4M:
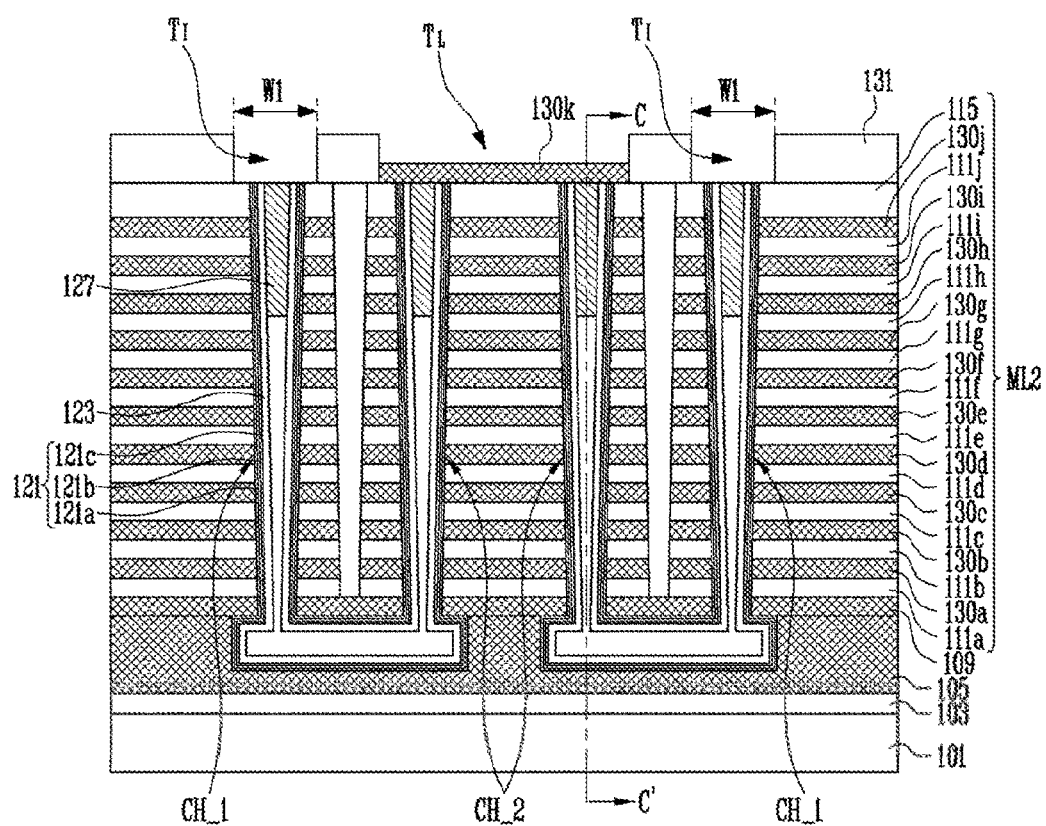
Figure 4N:
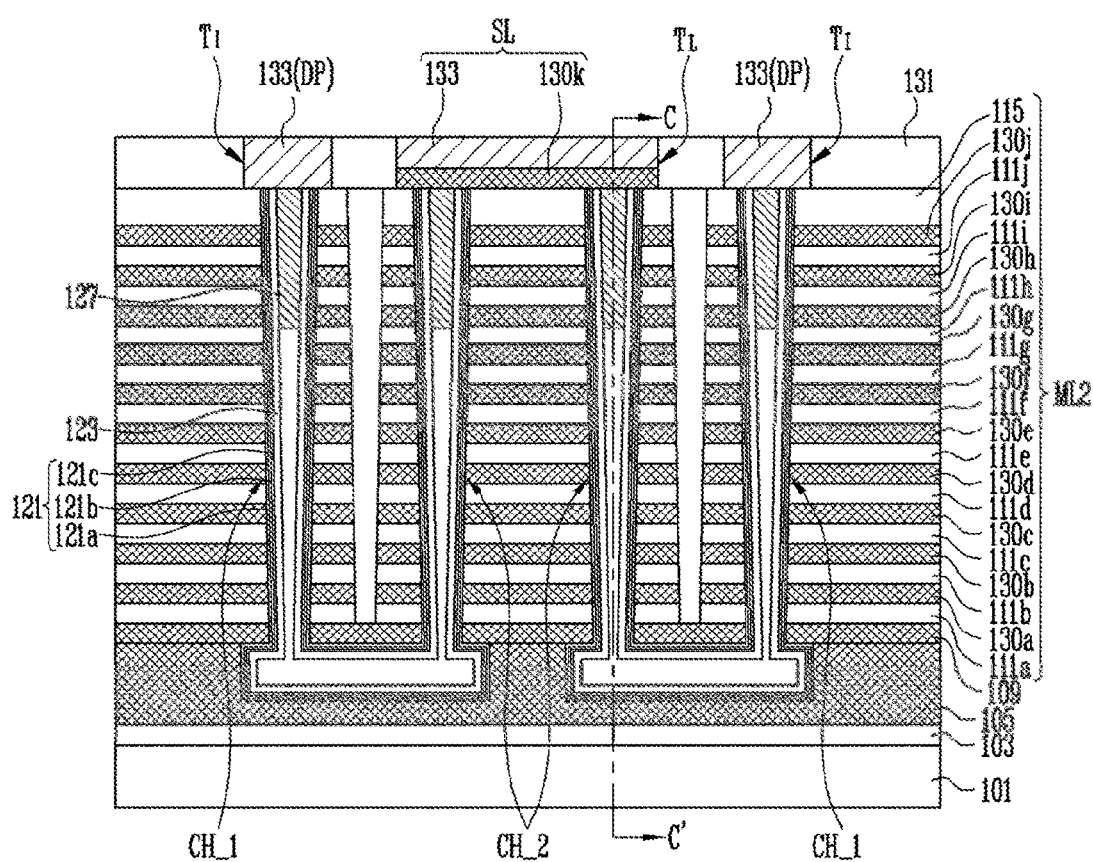
Figure 40:
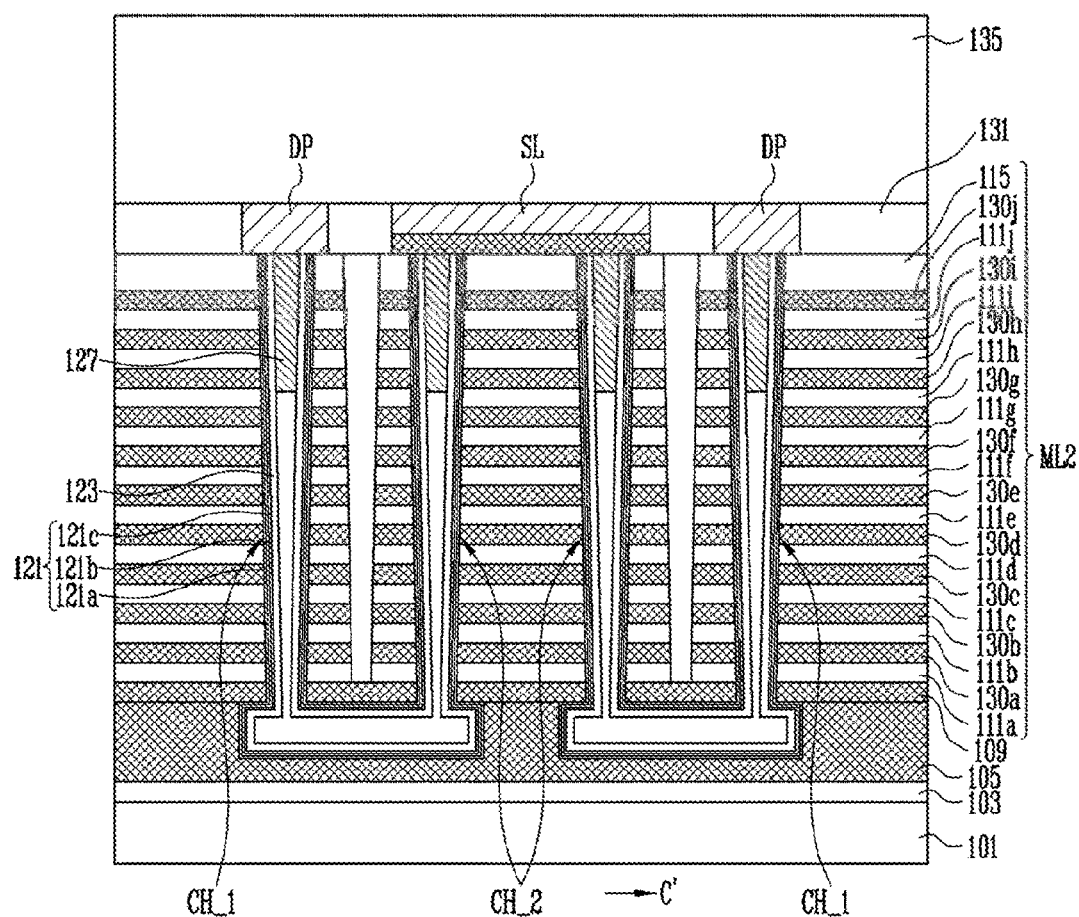
Figure 4P:
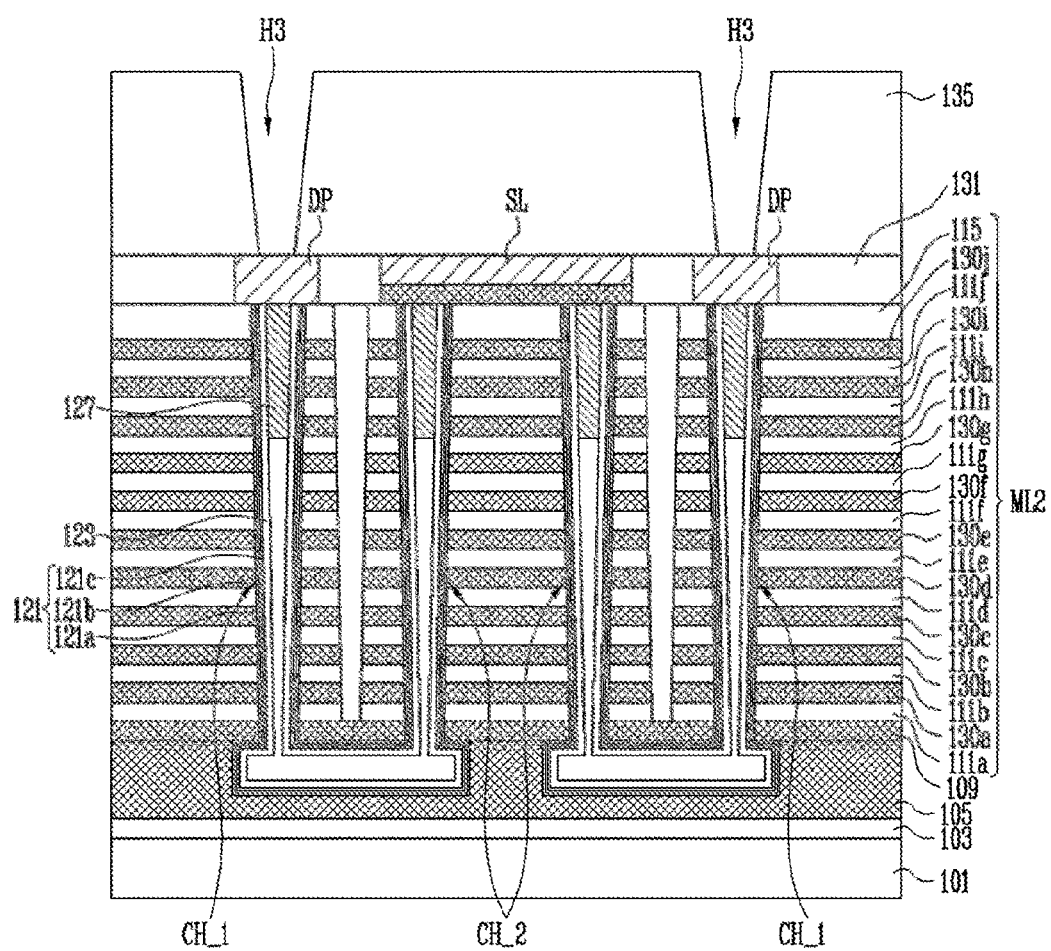

FIGS. 4A to 4P are cross-sectional views taken along line A-A' of the perspective view of FIG. 3 for illustrating a method of manufacturing an embodiment of the nonvolatile memory device shown in FIG. 3. FIGS. 5A to 5D are cross-sectional views taken along line C-C' of the cross-sectional views of FIGS. 4K to 4N, respectively.

Referring to FIG. 4A, a first interlayer insulating layer 103 may be formed on the substrate 101. Subsequently, the pipe gate PG having sacrificial layers 107 filled therein may be formed on the first interlayer insulating layer 103. The first interlayer insulating layer 103 may be formed to insulate the pipe gate PG and the substrate 101 from each other. The first interlayer insulating layer 103 may include a silicon oxide layer SiO2. The pipe gate PG may include a first conductive layer 105 configured as the first pipe gate PG1 and a second conductive layer 109 configured as the second pipe gate PG2. The first conductive layer 105 may be formed over the first interlayer insulating layer 103. After the first conductive layer 105 is formed, portions of the first conductive layer 105 may be etched to form trenches T arranged in a matrix format including a plurality of rows and a plurality of columns in the first conductive layer 105. Subsequently, the trenches T may be filled with the sacrificial layers 107. The sacrificial layers 107 may include a silicon oxide layer SiO2. Subsequently, the second conductive layer 109 may be formed over the entire structure including the sacrificial layers 107. The first and second conductive layers 105, 109 may include a polysilicon layer.

Referring to FIG. 4B, second interlayer insulating layers 111a-111j may be arranged in a plurality of layers and the second sacrificial layers 113a-113j may be arranged in a plurality of layers formed over the entire structure including the second conductive layer 109 to form a first stacked structure ML1. The second sacrificial layers 113a-113g may be arranged in a plurality of layers and may be configured as word lines that are cell gates. Some of the second sacrificial layers 113a-113g may be configured as dummy word lines. The other second sacrificial layers 113h-113j may be configured as drain selection lines or as source selection lines. The second interlayer insulating layer 111a may be formed before the second sacrificial layer 113a. A third interlayer insulating layer 115 may be formed over an uppermost layer of the first stacked structure ML1. The second interlayer insulating layers 111a-111j may be arranged in a plurality of layers. The third interlayer insulating layer 115 may include a silicon oxide layer. The second sacrificial layers 113a-113j may include a polysilicon layer. The number of second sacrificial layers 113a-113j may vary based on the number of stacked memory cells.

Subsequently, a hard mask layer 117 may be formed over the first stacked structure ML1. The hard mask layer 117 may include a material having an etch selectivity with respect to the second interlayer insulating layers 111a-111j that are arranged in a plurality of layers, the second sacrificial layers 113a-113j that are arranged in a plurality of layers, and the third interlayer insulating layer 115 that may include a silicon nitride layer SiN.

Referring to FIG. 4C, the hard mask layer 117 may be patterned by using a photolithography process to form a hard mask (117) pattern exposing portions of the first stacked structure ML1. Vertical holes H1, H2 are formed in the exposed portions of the first vertical stacked structure ML1. The sections of the first stacked structure ML1 and the second conductive layer 109 that are exposed through the hard mask (117) pattern may be removed using an etch process to form the vertical holes H1, H2. The two ends of the first sacrificial layer 107 are exposed at the lower portion of the vertical holes H1, H2. For the sake of convenience, one of the pair of the vertical holes H1, H2 may be referred to as a first vertical hole H1, and the other one of the pair of vertical holes may be referred to as a second vertical hole H2. The second vertical holes H2 may, for example, be formed between the first vertical holes H1.

Referring to FIG. 4D, protective layers 119 may be formed along the inner sidewalls of the first and second vertical holes H1, H2. The protective layers 119 may include a material having an etch selectivity with respect to the first sacrificial layer 107, the second interlayer insulating layers 111a-111j, and the third interlayer insulating layer 115. Similar to the hard mask layer, 117, the protective layers 119 may include a silicon nitride layer. The protective layers 119 may have a relatively smaller thickness than the hard mask layer 117 pattern so that the hard mask (117) pattern may not be completely removed during subsequent processes associated with the removal of the protective layers 119.

Referring to FIG. 4E, the first sacrificial layers 107 may be removed using an etching material to selectively etch the first sacrificial layers 107 to form the trenches T. When both the second and third interlayer insulating layers 111a-111j, 115 include substantially the same material as the first sacrificial layers 107, the second and third interlayer insulating layers 111a-111j, 115 may be protected by the protective layers 119. The hard mask layer 117 including the material having an etch selectivity with respect to the first sacrificial layers 107 may remain following the removal of the first sacrificial layers 107. When the first sacrificial layers 107 include a material having an etch selectivity with respect to the second and third interlayer insulating layers 111a-111j, 115, the process for forming the protective layers 119 may be omitted.

Referring to FIG. 4F, the protective layers 119 may be removed using an etching material to selectively etch the protective layers 119 so that inner sidewalls of the first and second vertical holes H1, H2 may be exposed. When the protective layers 119 are removed, a portion of the hard mask layer 117 including substantially the same material as the protective layers 119 may be removed. However, since the hard mask layer 117 has a relatively greater thickness than the protective layers 119, a relatively thinner layer of the hard mask layer 117 may remain.

Referring to FIG. 4G, the multilayer film 121 may be formed on the surface of the entire structure including inner surfaces of the trench T and the inner surfaces of the first and second vertical holes H1, H2. The multilayer film 121 may include a charge blocking layer 121a, a charge trap layer 121b and a tunnel insulating layer 121c. The charge trap layer 121b may include a silicon nitride layer (SiN), a hafnium oxide layer (HfO2), or a zirconium oxide layer (ZrO2) that is capable of trapping charge. The charge blocking layer 121a and the tunnel insulating layer 121c may include a silicon oxide layer.

Subsequently, U-shaped channel layers 123 may be formed on the surface of the entire structure including the multilayer films 121. The U-shaped channel layer 123 may be a semiconductor layer and include a silicon layer. The U-shaped channel layer 123 may be formed on the surface of the multilayer film 121, or the inner surfaces of the trench T and the first and second vertical holes H1, H2 that are coated with the multilayer film 121. The portion of the U-shaped channel layer 123 formed along the inner surface of the first vertical hole H1 may be referred to as the first vertical channel layer CH_1. The portion of the U-shaped channel layer 123 formed along the inner surface of the second vertical hole H2 may be referred to as the second vertical channel layer CH_2. The portion of the U-shaped channel layer 123 formed on the inner surface of the trench T may be referred to as the pipe channel layer CH_P.

When the U-shaped channel layer 123 is formed on the surface of the multilayer film 121, the trench T and the first and second vertical holes H1, H2 that are coated with the U-shaped channel layer 123 may be filled with the gap-filling insulating layer 125. The gap-filling insulating layer 125 may include an insulating material having relatively high fluidity so that the trench formed in the first conductive layer 105 and the first and second vertical holes H1, H2 may be filled while minimizing the creation of voids. For example, the gap-filling insulating layer 125 may include polysilazane (PSZ). Subsequently, the gap-filling insulating layer 125 may be planarized by a planarization process until the U-shaped channel layer 123 is exposed. Subsequently, the multilayer film 121 may be planarized by a planarization process until the hard mask patterns 117a is exposed. The planarization process may be performed using Chemical Mechanical Polishing (CMP).

Referring to FIG. 4H, after the hard mask patterns 117a are removed, the portions of the gap-filling insulating layers 125 that are exposed through the first and second vertical holes H1, H2 may be etched so that a height of the gap-filling insulating layers 125 may be relatively less than that of the first stacked structure ML1. Subsequently, the spaces formed by the removal of the gap-filling insulating layers 125 may be filled with the doped polysilicon layers 127.

The doped polysilicon layers 127 may contact upper sidewalls of the first and second vertical channel layers CH_1, CH_2. The doped polysilicon layers 127 may reduce channel resistance of the memory strings. Conditions, such as dopant type and concentration, may vary with operating characteristics of the semiconductor device.

Referring to FIG. 4I, portions of the first stacked structure ML1 between the first and second vertical holes H1, H2 may be etched to form the slits SLT that vertically pass through the first stacked structure ML1. The slits SLT may be formed to expose the second conductive layer 109 and extend generally in the same direction that the second sacrificial layers 113a-113j extend (y direction in FIG. 3). The second sacrificial layers 113a-113j of the first stacked structure ML1 may be separated into word lines and drain selection lines surrounding the first vertical hole H1 and word lines and source selection lines surrounding the second vertical hole H2.

Referring to FIG. 4J, the second sacrificial layers 113a-113j may be removed. Since the second sacrificial layers 113a-113j are exposed through the slits SLT, a wet etch process may be performed to remove the second sacrificial layers 113a-113j by using an etchant in where an etch rate of the second sacrificial layers 113a-113j is relatively higher than that of the second interlayer insulating layers 111a-111j. When the second sacrificial layers 113a-113j are removed, recesses RC may be formed between the second interlayer insulating layers 111a-111j.

Figure 5A:
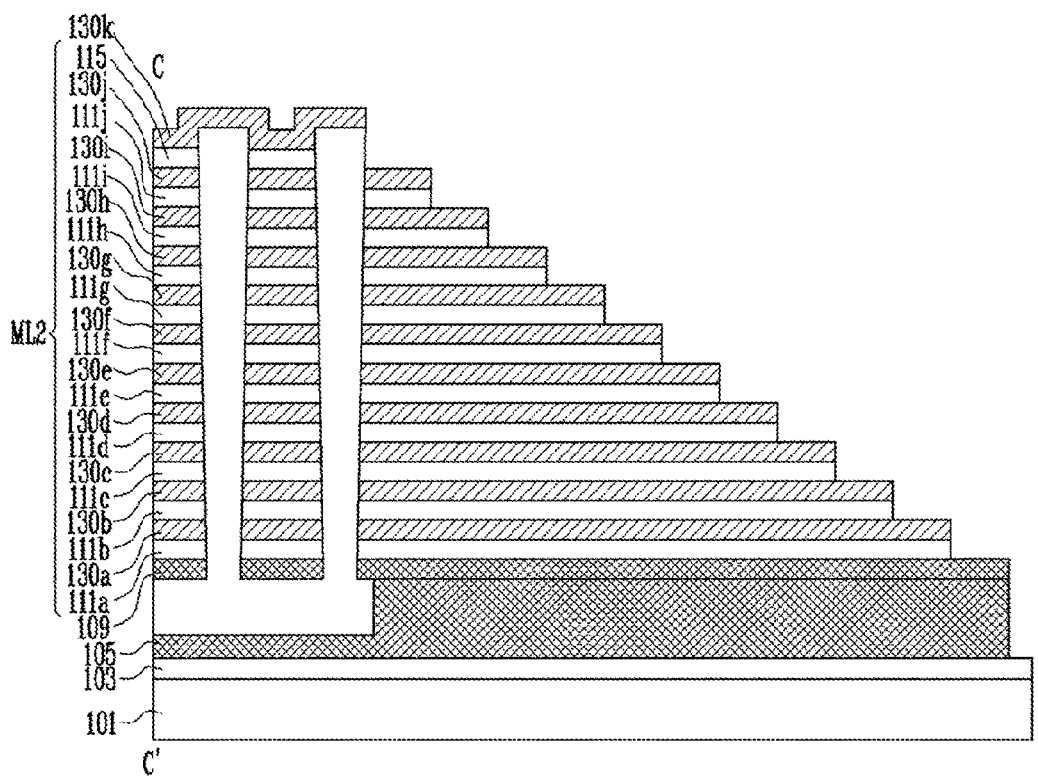
FIGS. 5A to 5D are cross-sectional views taken along line C-C' of the cross-sectional views of FIGS. 4K to 4N, respectively.

Referring to FIGS. 4K and 5A, the recesses RC may be filled with third conductive layers 130a-130k. The third conductive layer 130k may be formed over the second vertical channel layers CH_2. A second stacked structure ML2 may be formed where the second interlayer insulating layers 111a-111j and the third conductive layers 130a-130j are alternately stacked. The third conductive layers 130a-130j may be formed in a peripheral region to create a stepped stacked structure.

Subsequently, the third conductive layers 130a-130k may be removed from the slits SLT, and may then be filled with gap-filling insulating layers 129. The gap-filling insulating layers 129 may include an insulating material having a high fluidity to fill the relatively long narrow slits with a reduced number of voids. For example, the gap-filling insulating layers 129 may include polysilazane (PSZ).

Figure 5B:
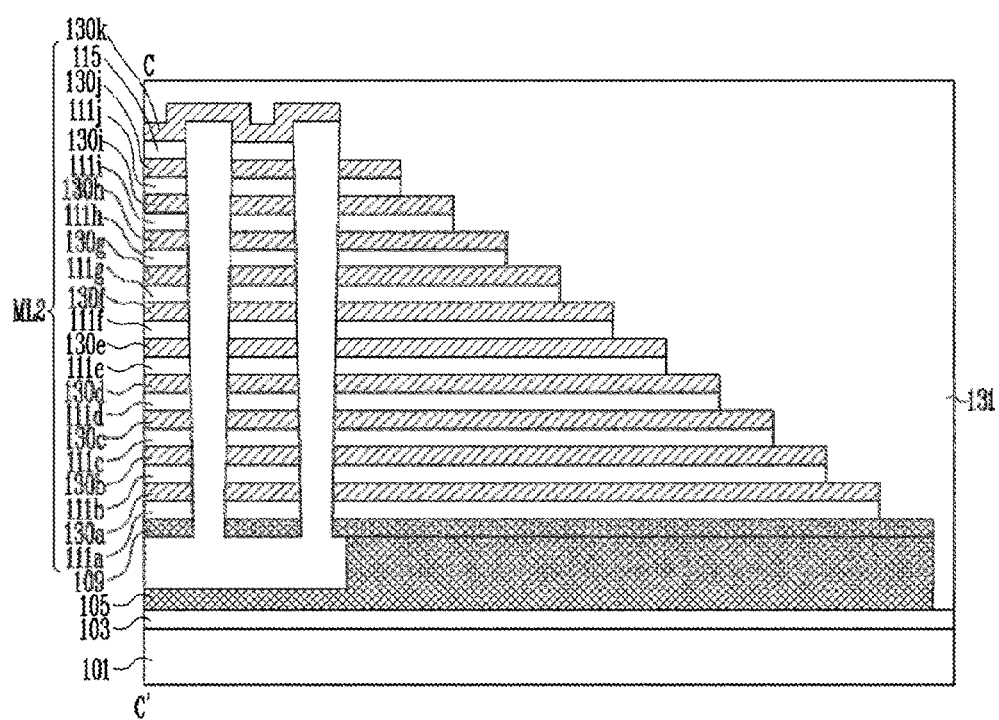

Referring to FIGS. 4L and 5B, a fourth interlayer insulating layer 131 may be formed over the entire structure including the stepped stacked structure. The fourth interlayer insulating layer 131 may include a silicon oxide layer. When the fourth interlayer insulating layer 131 is formed, pads and common source lines that are formed later may be taken into account since thicknesses of the pads and the common source lines are determined by a height of the fourth interlayer insulating layer 131.

Figure 5C:
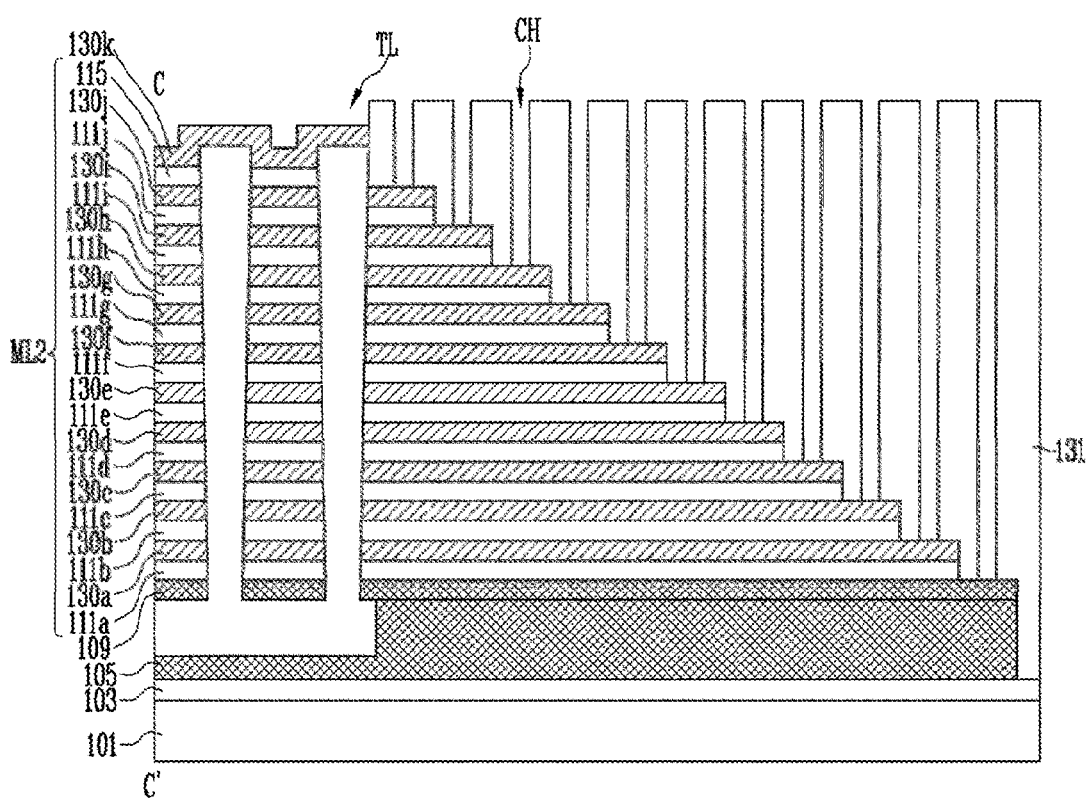

Referring to FIGS. 4M and 5C, portions of the fourth interlayer insulating layer 131 may be removed to form drain trenches TI, a source trench TL and contact holes CH. Portions of the first vertical channel layers CH_1, the doped polysilicon layer 127 and the third interlayer insulating layer 115 may be exposed through the drain trenches TI. The third conductive layer 130k may be formed through the source trench TL. The third conductive layers 130a-130j of the stepped stacked structure and a portion of the second conductive layer 109 may be exposed through the contact holes CH. The drain trench TI may have an island shape to expose a region where the first vertical channel layer CH_1 is formed. The source trench TL may have a generally linear shape and may expose the third conductive layer 130k. The drain trenches TI may be formed generally parallel to the y direction shown in FIG. 3, and the source trench TL may extend in generally the y direction shown in FIG. 3. To reduce or prevent misalignment when forming contact plugs, a width W1 of the drain trench TI may be relatively greater than a width of the first vertical channel layer CH_1, and a width of the source trench TL may be substantially equal to or relatively smaller than that of the third conductive layer 130k.

Figure 5D:
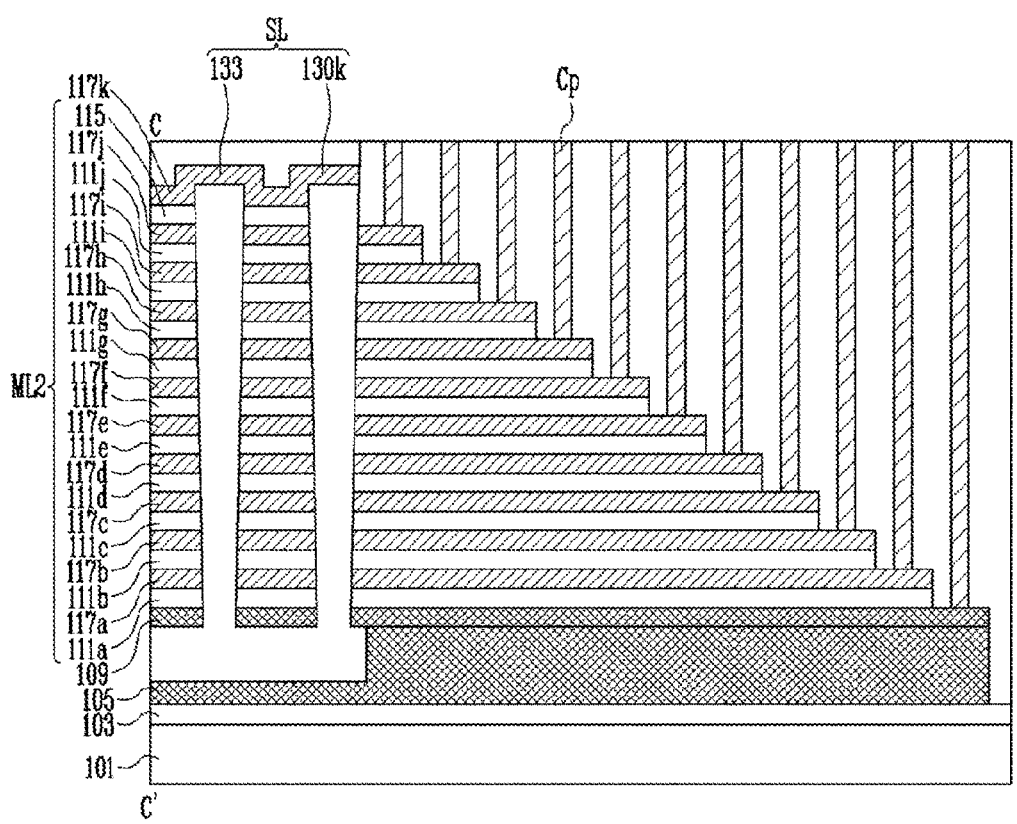

Referring to FIGS. 4N and 5D, the drain trenches TI, the source trench TL and the contact holes CH may be filled with a conductive material 133 to form the pads DP, the common source line SL and the contact plugs CP. The conductive material 133 filling the drain trenches TI may be the pads DP. The conductive material 133 and the third conductive layer 130k filling the source trench TL may be the common source line SL. The conductive material 133 filling the contact holes CH may be the contact plugs CP. The pads DP and the common source line SL are formed by filling the drain trenches TI and the source trench TL with the conductive material 133 using a damascene method. In an embodiment, the pads DP and the common source line SL may be formed by a single damascene method. However, a dual damascene method may be used. The conductive material 133 may include a polysilicon layer, a metal layer, or a stacked layer of a polysilicon layer and a metal layer.

Since a contact plug is not used to electrically couple the second vertical channel layer CH_2 and the common source line SL the possibility of a misalignment of a contact plug is eliminated where the common source line SL is formed. Since the second vertical channel layer CH_2 and the common source line SL are directly electrically coupled to each other, resistance between the second vertical channel layer CH_2 and the common source line SL may be reduced.

Referring to FIG. 4O, a fifth interlayer insulating layer 135 may be formed over the entire structure including the pads DP and the common source line SL. The fifth interlayer insulating layer 135 may include a silicon oxide layer. Since the common source line SL directly contacts the second vertical channel layer CH_2, it may be relatively easier to control a thickness of the fifth interlayer insulating layer 135.

Referring to FIG. 4P, portions of the fifth interlayer insulating layer 135 may be etched to form third vertical holes H3 through which the pads DP are exposed. The third vertical holes H3 may have a relatively smaller width than the pads DP. During an etch process for forming the third vertical holes H3, a misalignment may occur. However, since the pad DP has a relatively large width, the area of the pads DP exposed through the third vertical holes H3 may be maintained.

Figure 4Q:
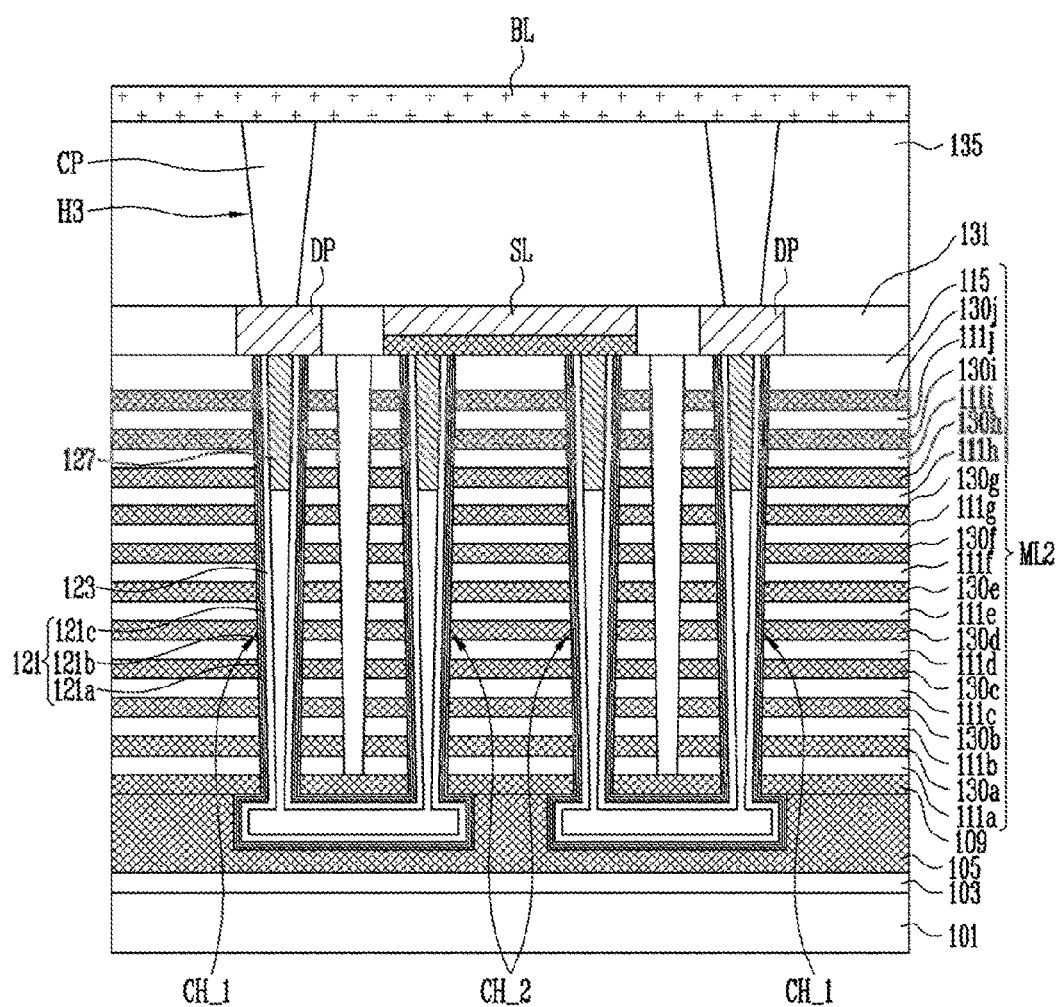

Referring to FIG. 4Q, the third vertical holes H3 may be filled with a conductive material to form the contact plug CP. The conductive material may include a polysilicon layer or a metal layer. Subsequently, a conductive layer may be formed over the entire structure including the contact plugs CP to form the bit line BL.

According to the above-described embodiment, the position of the pad DP may be determined by the position of the first vertical channel layer CH_1. The arrangement of the pads DP is described below.

Figure 6A:
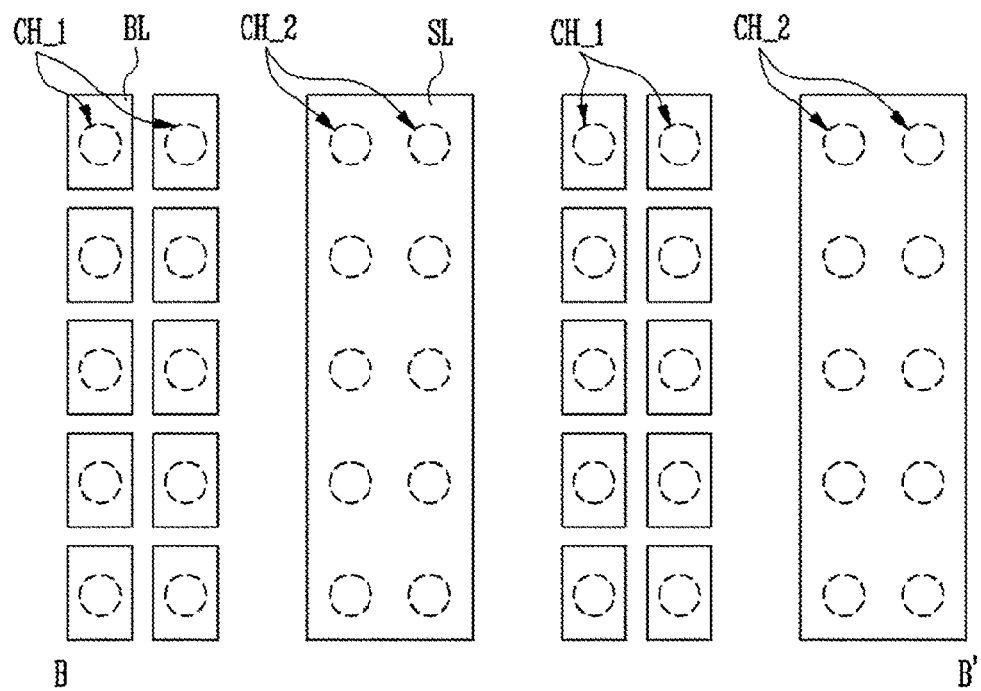
FIGS. 6A and 6B are layout views taken along line B-B' of the perspective view of FIG. 3 for illustrating the arrangement of pads and common source lines shown in FIG. 3.
Figure 6B:
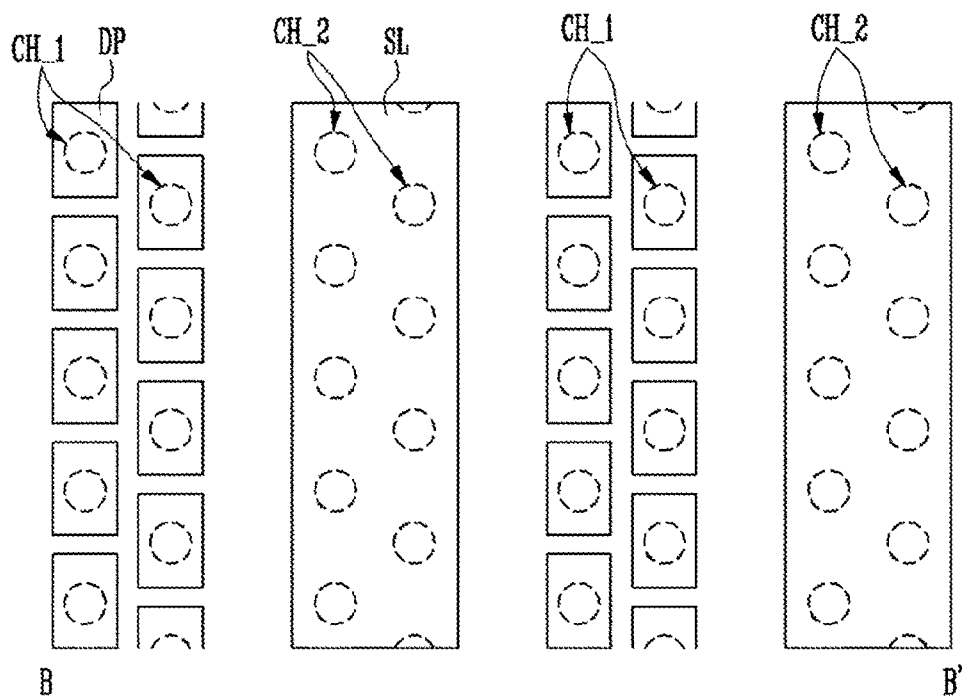

FIGS. 6A and 6B are layout views taken along line B-B' of the perspective view of FIG. 3 for illustrating the arrangement of the pads and the common source lines shown in FIG. 3.

Referring to FIG. 6A, when the first vertical channel layers CH_1 and the second vertical channel layers CH_2 are arranged in a generally parallel configuration with respect to each other, the pads DP may be arranged in a generally parallel configuration with respect to each other based on the position of the first vertical channel layers CH_1. The common source lines SL may generally extend in the y direction, as shown in FIG. 3, to commonly electrically contact the second vertical channel layers CH_2 arranged in generally the y direction.

Referring to FIG. 6B, when the first vertical channel layers CH_1 and the second vertical channel layers CH_2 are arranged in a zigzag pattern, the pads DP may be arranged in a zigzag pattern based on the position of the first vertical channel layers CH_1. The common source lines SL may extend in generally the y direction, as shown in FIG. 3, to commonly electrically contact the second vertical channel layers CH_2 arranged in generally the y direction.

Figure 7:
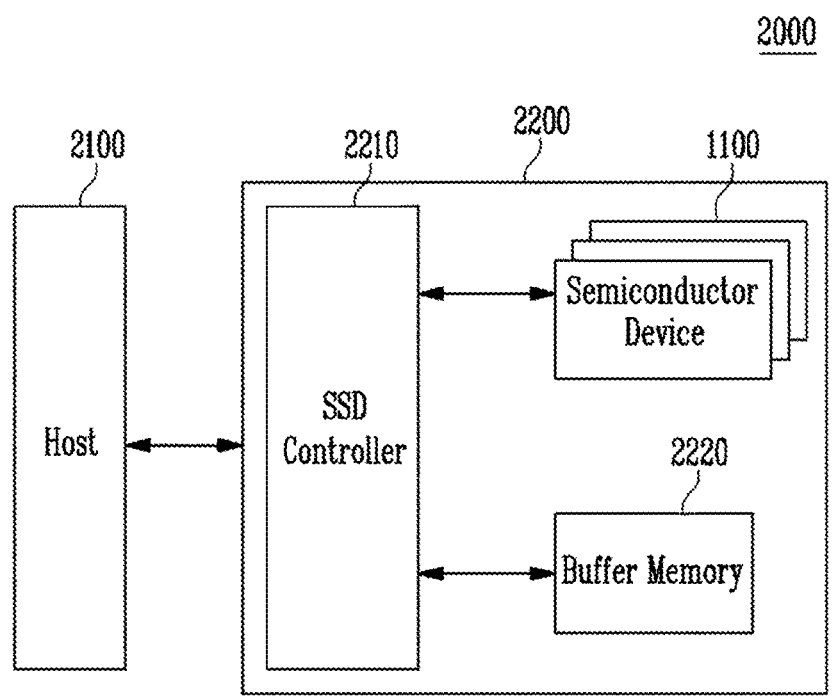
FIG. 7 is a block diagram representation of a solid state drive including an embodiment of a semiconductor device.

FIG. 7 is a block diagram representation of a solid state drive (SSD) 2200 including an embodiment of a semiconductor device 1100.

A drive device 2000 may include a host 2100 and an SSD 2200. The SSD 2200 may include an SSD controller 2210, a buffer memory 2220 and a semiconductor device 1100.

The SSD controller 2210 may provide a physical connection between the host 2100 and the SSD 2200. In other words, the SSD controller 2210 may provide an interface with the SSD 2200 in response to a bus format of the host 2100. The SSD controller 2210 may decode a command received from the host 2100. According to a decoding result, the SSD controller 2210 may access the semiconductor device 1000. Examples of the bus format of the host 2100 include, but are not limited to, Universal Serial Bus (USB), Small Computer System Interface (SCSI), Peripheral Component Interconnect Express (PCI-E), Advanced Technology Attachment (ATA), Parallel ATA (PATA), Serial ATA (SATA), and Serial Attached SCSI (SAS).

The buffer memory 2220 may temporarily store program data received from the host 2100 or data read from the semiconductor device 1100. When a read request is made by the host 2100, if data in the semiconductor device 1100 is cached, the buffer memory 2220 may support a cache function to directly provide the cached data to the host 2100. In general, a data transfer speed by the bus format (for example, SATA or SAS) of the host 2100 may be relatively higher than a transfer speed of a memory channel of the SSD 2200. In other words, when an interface speed of the host 2100 is relatively higher than the transfer speed of the memory channel of the SSD 2200, performance degradation caused by the speed difference may be minimized by providing the buffer memory 2220 having a relatively large capacity. The buffer memory 2220 may be a Synchronous DRAM and may provide sufficient buffering in the SSD 2200.

The semiconductor device 1100 may be used as a storage medium of the SSD 2200. For example, the semiconductor device 1000 may be a nonvolatile memory device having a relatively large storage capacity as described above with reference to FIG. 1. The semiconductor device 1000 may be a NAND-type flash memory, among nonvolatile memories.

Figure 8:
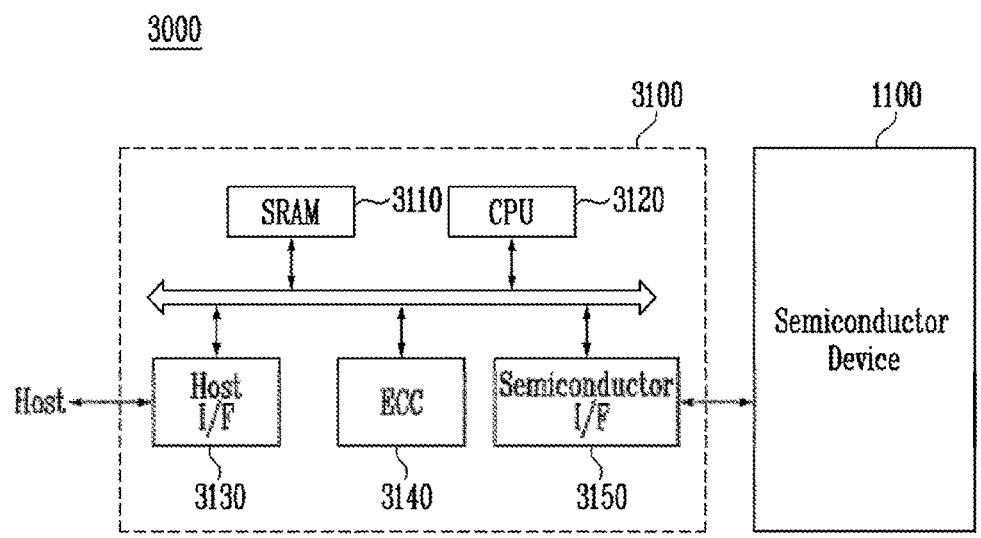
FIG. 8 is a block diagram representation of a memory system including an embodiment of a semiconductor device.

FIG. 8 is a block diagram representation of a memory system 3000 including an embodiment of a semiconductor device 1100.

The memory system 3000 may include a memory control unit 3100 and an embodiment of a semiconductor device 1100.

Since the semiconductor device 1100 may be configured in substantially the same manner as the semiconductor device shown in FIG. 3, a description of the semiconductor device 1100 has been omitted.

The memory control unit 3100 may be configured to control the semiconductor device 1100. An SRAM 3110 may be used as a working memory of a CPU 3120. A host interface (I/F) 3130 may include a data exchange protocol of a host electrically coupled with the memory system 3000. An error correction circuit (ECC) 3140 in the memory control unit 3100 may detect and correct an error in data read from the semiconductor device 1100. A semiconductor I/F 3150 may interface with the semiconductor device 1100. The CPU 3120 may perform a control operation for data exchange of the memory control unit 3100. A ROM (not shown) for storing code data for interfacing with a host may be provided in the memory system 3000.

In an embodiment, the memory system 3000 may be applied to one of a computer, an Ultra Mobile PC (UMPC), a workstation, a net-book, a PDA, a portable computer, a web tablet, a wireless phone, a mobile phone, a smartphone, a digital camera, a digital audio recorder, a digital audio player, a digital picture recorder, a digital picture player, a digital video recorder, a digital video player, a device of transmitting and receiving information in a wireless environment, and various devices constituting a home network.

Figure 9:
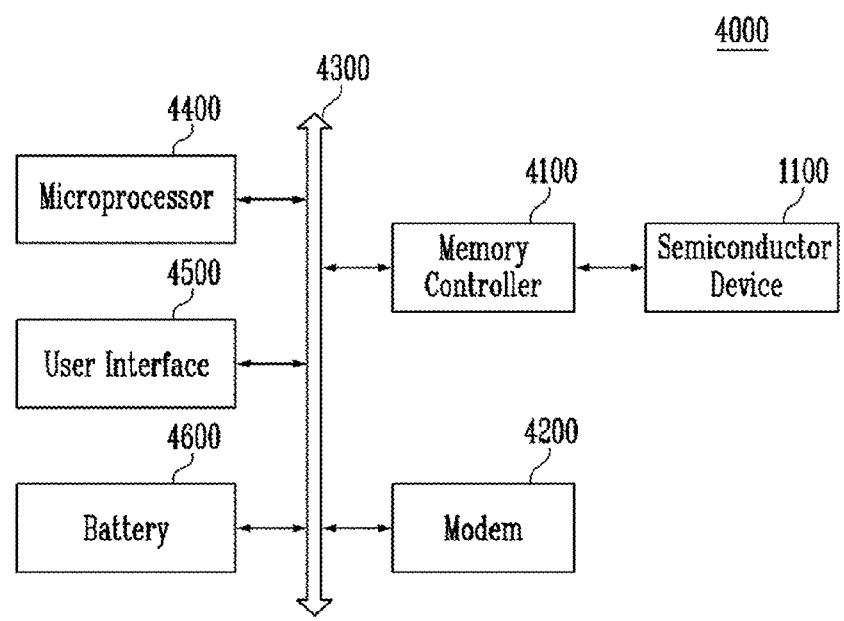
FIG. 9 is a block diagram representation of a computing system including an embodiment of a semiconductor device.

FIG. 9 is a block diagram representation of a computing system 4000 including an embodiment of a semiconductor device 1100.

The computing system 4000 may include the semiconductor device 1100, a memory controller 4100, a modem 4200, a microprocessor 4400, and a user interface 4500 electrically coupled to a bus 4300. When the computing system 4000 is a mobile device, a battery 4600 for supplying an operation voltage of the computing system 4000 may be provided. The computing system 4000 may include an application chip set (not shown), a camera image processor (CIS) (not shown), a mobile DRAM (not shown), and the like. The computing system 4000 may include an application chip set (not shown), a camera image processor (CIS) (not shown) and a mobile DRAM (not shown), and the like.

The semiconductor device 1100 may be configured in substantially the same manner as the semiconductor device 1000 shown in FIG. 1. Thus, a description thereof will be omitted.

The memory controller 4100 and the semiconductor device 1100 may constitute a Solid State Drive/Disk (SSD).

The semiconductor device 1100 and the memory controller 4100 may be mounted using various different types of packages. For example, the semiconductor device 1100 and the memory controller 4100 may be mounted using packages such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-level Processed Stack Package (WSP), and the like.

Memory devices having a relatively high yield and relatively good reliability may be manufactured by reducing misalignment in a manufacturing process of memory devices. A degree of integration of a memory device may be improved by electrically coupling a source line to a vertical channel layer without the use of a contact plug.

While certain embodiments have been described above, it will be understood to those skilled in the art that the embodiments described are by way of example only. Accordingly, the three-dimensional nonvolatile memory device, a semiconductor system including the same, and a method of manufacturing the same should not be limited based on the described embodiments. Rather, the three-dimensional nonvolatile memory device, a semiconductor system including the same, and a method of manufacturing the same described herein should only be limited in light of the claims that follow when taken in conjunction with the above description and accompanying drawings.

What is claimed is:

1. A method of manufacturing a three-dimensional nonvolatile memory device, the method comprising:
    depositing a plurality of interlayer insulating layers and a plurality of sacrificial layers in a stacked configuration along first vertical channel layers and second vertical channel layers, wherein the first and second vertical channel layers extend from a substrate;
    etching portions of the plurality of the interlayer insulating layers and the plurality of sacrificial layers to form a slit, wherein portions of the sacrificial layers are exposed through a sidewall of the slit;
    removing the portions of the sacrificial layers exposed by the slit to form recesses between the interlayer insulating layers;
    filling the recesses with conductive layers to form a plurality of word lines;
    forming pads having a generally island shape over the first vertical channel layers;
    forming a common source line having a generally rectangular shape over the second vertical channel layers;
    forming contact plugs over the pads; and
    forming a bit line over the contact plugs;
    wherein a width of the pad is greater than that of the first vertical channel layer and that of the contact plug.

2. The method of claim 1, wherein the pads and the common source line are formed at substantially the same time.

3. The method of claim 1, wherein the pads and the common source line include one of a polysilicon layer, a metal layer, and a stacked layer of a polysilicon layer and a metal layer.

4. The method of claim 1, wherein the pads and the first vertical channel layers have a relatively greater width than the contact plugs.

5. The method of claim 1, wherein the common source line is in electrical contact with the second vertical channel layers.

6. The method of claim 1, further comprising forming a conductive layer over the second vertical channel layers during the forming of the plurality of word lines.

7. The method of claim 6, wherein the conductive layer formed over the second vertical channel layers is included in the common source line.

8. A method of manufacturing a three-dimensional nonvolatile memory device, the method comprising:
    depositing a plurality of interlayer insulating layers and a plurality of sacrificial layers in a stacked configuration along first vertical channel layers and second vertical channel layers, wherein the first and second vertical channel layers extend from a substrate;
    etching portions of the plurality of the interlayer insulating layers and the plurality of sacrificial layers to form a slit, wherein portions of the sacrificial layers are exposed through a sidewall of the slit;
    removing the portions of the sacrificial layers exposed by the slit to form recesses between the interlayer insulating layers;
    forming word lines within the recesses;
    forming a lower conductive layer of a common source line over the second vertical channel layers;
    forming an insulating layer covering the lower conductive layer;
    forming pads and an upper conductive layer of the common source line passing through the insulating layer, wherein the pads are formed over the first vertical channel layers and the upper conductive layer is formed over the lower conductive layer;
    forming contact plugs over the pads; and
    forming a bit line over the contact plugs.

* * * * *